(12) United States Patent
Okahisa et al.

(10) Patent No.: US 11,359,275 B2
(45) Date of Patent: Jun. 14, 2022

(54) METHOD OF MANUFACTURING DIAMOND SUBSTRATE, DIAMOND SUBSTRATE, AND DIAMOND COMPOSITE SUBSTRATE

(71) Applicant: Sumitomo Electric Industries, Ltd., Osaka (JP)

(72) Inventors: Takuji Okahisa, Itami (JP); Yoshiyuki Yamamoto, Itami (JP); Yoshiki Nishibayashi, Itami (JP); Natsuo Tatsumi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 78 days.

(21) Appl. No.: 17/032,022

(22) Filed: Sep. 25, 2020

(65) Prior Publication Data

US 2021/0010131 A1 Jan. 14, 2021

Related U.S. Application Data

(62) Division of application No. 16/654,085, filed on Oct. 16, 2019, now Pat. No. 10,822,693, which is a
(Continued)

(30) Foreign Application Priority Data

Jun. 25, 2014 (JP) .............................. JP2014-130239

(51) Int. Cl.
*C30B 29/04* (2006.01)
*C23C 16/01* (2006.01)
(Continued)

(52) U.S. Cl.
CPC ............. *C23C 16/01* (2013.01); *C01B 32/25* (2017.08); *C01B 32/26* (2017.08); *C23C 14/48* (2013.01);
(Continued)

(58) Field of Classification Search
CPC ......... C01B 32/27; C23C 14/48; C23C 16/27; C30B 29/04
(Continued)

(56) References Cited

U.S. PATENT DOCUMENTS 5,127,983 A 7/1992 Imai et al.
2004/0180205 A1 9/2004 Scarsbrook et al.
(Continued)

FOREIGN PATENT DOCUMENTS

JP H03-075298 A 3/1991
JP 2006-210660 A 8/2006
(Continued)

OTHER PUBLICATIONS

International Search Report in counterpart International Application No. PCT/JP2015/068363, dated Sep. 1, 2015.
(Continued)

*Primary Examiner* — Archene A Turner
(74) *Attorney, Agent, or Firm* — Baker Botts L.L.P.; Michael A. Sartori

(57) ABSTRACT

A method of manufacturing a diamond substrate includes: forming an ion implantation layer at a side of a main surface of a diamond seed substrate by implanting ions into the main surface of the diamond seed substrate; producing a diamond structure by growing a diamond growth layer by a vapor phase synthesis method on the main surface of the diamond seed substrate, after implanting the ions; and performing heat treatment on the diamond structure. The performed heat treatment causes the diamond structure to be separated along the ion implantation layer into a first structure including the diamond seed substrate and failing to include the diamond growth layer, and a diamond substrate including the diamond growth layer. Thus, the method of manufacturing a diamond substrate is provided that enables a diamond sub-
(Continued)

strate with a large area to be manufactured in a short time and at a low cost.

2 Claims, 6 Drawing Sheets

Related U.S. Application Data division of application No. 15/321,493, filed as application No. PCT/JP2015/068363 on Jun. 25, 2015, now Pat. No. 10,487,395.

(51) Int. Cl.
| | | |
|---|---|---|
| C23C 16/27 | (2006.01) | |
| C23C 16/56 | (2006.01) | |
| C23C 16/02 | (2006.01) | |
| C01B 32/25 | (2017.01) | |
| H01L 21/762 | (2006.01) | |
| C30B 33/06 | (2006.01) | |
| C01B 32/26 | (2017.01) | |
| C23C 14/48 | (2006.01) | |
| C30B 25/20 | (2006.01) | |
| C30B 33/02 | (2006.01) | |
| C30B 33/10 | (2006.01) | |
| C30B 25/18 | (2006.01) | |

(52) U.S. Cl.
CPC .............. *C23C 16/02* (2013.01); *C23C 16/27* (2013.01); *C23C 16/271* (2013.01); *C23C 16/274* (2013.01); *C23C 16/56* (2013.01); *C30B 25/20* (2013.01); *C30B 29/04* (2013.01); *C30B 33/02* (2013.01); *C30B 33/06* (2013.01); *C30B 33/10* (2013.01); *H01L 21/76254* (2013.01); *C30B 25/18* (2013.01)

(58) Field of Classification Search
USPC ......................................................... 428/408
See application file for complete search history.

(56) References Cited

U.S. PATENT DOCUMENTS

| | | |
|---|---|---|
| 2007/0092647 A1 | 4/2007 | Scarsbrook et al. |
| 2007/0212543 A1 | 9/2007 | Twitchen |

FOREIGN PATENT DOCUMENTS

| | | |
|---|---|---|
| JP | 2007-112637 A | 5/2007 |
| JP | 2008526682 A | 7/2008 |
| JP | 2010-222252 A | 10/2010 |
| JP | 2011-061084 A | 3/2011 |
| JP | 2011-195407 A | 10/2011 |
| JP | 2012-086988 A | 5/2012 |
| WO | 2006076354 A2 | 7/2006 |

OTHER PUBLICATIONS

Liang et al "Large are single-crystal diamond synthesis by 915 MHz microwave plasma-assisted chemical vapor depostion" Crystal Growth & Design may (2014) p. 3234-3238. (Year: 2014).

Hong-Dong et al "High rate growth and nitrogen distribution in homoepitaxial chemical vapor deposited single crystal diamond" Chin.Phys.Lett vol. 25, No. 5 (2008) p. 18031806. (Year: 2008).

Schwartz et al "Effects of low-energy electron irradiation on formation of nitrogen-vacancy centers in single-crystal diamond" New Journal of Physics, 14 (2012) p. 1-8. (Year: 2012).

Liang et al "Enhancing the mechanical properties of single crystal CVD diamond" J. Phys. Condens. Matter 21 (2009) p. 1-6. (Year: 2009).

(A)

(B)

(C)

METHOD OF MANUFACTURING DIAMOND SUBSTRATE, DIAMOND SUBSTRATE, AND DIAMOND COMPOSITE SUBSTRATE

TECHNICAL FIELD

The present invention relates to a method of manufacturing a diamond substrate, and relates to a diamond substrate and a diamond composite substrate including this diamond substrate.

BACKGROUND ART

Diamond has many outstanding properties such as high hardness and high thermal conductivity, and additionally high light transmission rate and wide bandgap energy. Diamond is therefore used widely as a material for various tools, optics, semiconductor devices or electronic components, and will become still more important in the future.

In industry, in addition to natural diamonds, artificially synthesized diamonds having a stable quality are mainly used. Currently, most of artificially synthesized single crystals of diamond are produced by synthesis in a high-temperature high-pressure environment (diamond is stable in this environment) at a temperature on the order of one thousand and several hundred degrees to two thousand and several hundred degrees and a pressure of several tens of thousands of atmospheres or more (high-temperature high-pressure method).

An ultrahigh pressure vessel in which the aforementioned high-temperature high-pressure environment is to be generated is very expensive and restricted in size. Therefore, when a single crystal diamond substrate is synthesized by the high-temperature high-pressure method, the size of the resultant single crystal diamond substrate is limited. With regard to Type Ib diamond containing nitrogen (N) as an impurity and having a yellowish color, a single crystal substrate of Type Ib diamond having a diameter of 10 mm is being manufactured by the high-temperature high-pressure method. However, the size on the order of 10 mm in diameter is considered as a substantial limit. With regard to transparent and colorless Type IIa diamond containing no impurity, a single crystal substrate of Type IIa diamond manufactured by the high-temperature high-pressure method has a diameter on the order of only several millimeters or less, except for natural Type IIa diamond.

In addition to the high-temperature high-pressure method, the vapor phase synthesis method is an established diamond synthesis method. The vapor phase synthesis method can be used to grow a diamond crystal substrate with a relatively large area having a diameter on the order of six inches (152.4 mm). Usually, a polycrystal of diamond is obtained by this method. When the diamond is used particularly as a material for an ultraprecision tool or optic required to have a smooth surface, or as a material for a semiconductor device required to have a precisely controlled impurity concentration or high carrier mobility, for example, among industrial uses of the diamond, a single crystal of diamond is used. Therefore, how to epitaxially grow a single crystal diamond substrate by the vapor phase synthesis method is being studied.

Generally, epitaxial growth includes homoepitaxial growth producing a growth layer of the same material as the material for the seed substrate, and heteroepitaxial growth producing a growth layer of a material different from the material for the seed substrate. It has been considered difficult to grow a single crystal of diamond by heteroepitaxial growth. In recent years, a free-standing diamond film having a diameter on the order of one inch (25.4 mm) has been formed, and thus growth of a single crystal diamond by heteroepitaxial growth has remarkably advanced. However, the crystal quality of the single crystal of diamond obtained by the heteroepitaxial growth is inferior to the crystal quality of a single crystal of diamond obtained by the homoepitaxial growth. It is therefore considered preferable to study how to synthesize a single crystal diamond substrate by homoepitaxial growth to thereby establish a method of manufacturing a single crystal diamond substrate having a large area.

In the case of homoepitaxial growth, high-purity diamond is grown by vapor deposition on a Type Ib diamond substrate (seed substrate) which is obtained by the high-temperature high-pressure method, for example, and thereafter the seed substrate is removed. In this way, a Type IIa diamond substrate having a larger area than a Type IIa diamond substrate obtained by the high-temperature high-pressure method can be produced. As disclosed in Japanese Patent Laying-Open No. 3-75298 (PTD 1), it has been reported that a plurality of diamond substrates or diamond crystals in the same crystal orientation can be used to integrally grow diamond thereon to obtain diamond having low angle grain boundaries only.

Problems in synthesis of a single crystal diamond substrate by homoepitaxial growth are how to remove and how to reuse the seed substrate. When a Type Ib diamond substrate or the like is used as a seed substrate to manufacture a single crystal diamond substrate, it is necessary to remove the seed substrate from the growth layer (which is to serve as a single crystal diamond substrate) by a certain method. This method may for example be a method to detach the growth layer from the seed substrate, or a method to completely remove the seed substrate. The seed substrate is formed of a single crystal of diamond and therefore expensive. In view of this, it is preferable to employ the former method. For example, a typical method is slicing with a laser beam.

However, in the case of slicing with a laser beam, a growth layer having a larger area requires a correspondingly greater thickness of the seed substrate or is accompanied by a decreased rate of success. Therefore, for a growth layer formed of a single crystal of diamond of 10 mm×10 mm for example, it is difficult to detach the growth layer from the seed substrate by slicing with a laser beam and thus the method to completely remove the seed substrate (the latter method) must be used. The method to completely remove the seed substrate may polish the seed substrate with diamond abrasive grains, may cause the seed substrate to react with an iron surface so that a part of the seed substrate which has reacted with the iron surface is removed, or may apply an ion beam to the seed substrate, for example. However, any method requires a long time to completely remove the seed substrate. Moreover, in the case of this method, the substrate (seed substrate) obtained by the high-temperature high-pressure method cannot be reused and thus the cost for manufacturing the single crystal diamond substrate cannot be reduced.

Under the above circumstances, Japanese Patent Laying-Open No. 2011-195407 (PTD 2) and Japanese Patent Laying-Open No. 2012-86988 (PTD 3) each disclose a method of detaching a diamond layer (a part to serve as a single crystal diamond substrate) by implanting ions into the diamond seed substrate to form an electrically conductive non-diamond layer and electrochemically etching away the non-diamond layer.

CITATION LIST

Patent Document

PTD 1: Japanese Patent Laying-Open No. 3-75298
PTD 2: Japanese Patent Laying-Open No. 2011-195407
PTD 3: Japanese Patent Laying-Open No. 2012-86988

SUMMARY OF INVENTION

Technical Problem

According to the technique disclosed in Japanese Patent Laying-Open Nos. 2011-195407 and 2012-86988, the non-diamond layer is brought into contact with an etching solution to be etched away. Due to the thin thickness of the non-diamond layer, the etch rate is considerably slow. Therefore, when the technique disclosed in Japanese Patent Laying-Open Nos. 2011-195407 and 2012-86988 is used to manufacture a single crystal diamond substrate having a large area, the etching time for the non-diamond layer is exceedingly long. Even when a single crystal diamond substrate of 4 mm×4 mm is to be manufactured, etching of the non-diamond layer takes 10 hours or more. It is therefore difficult to manufacture a large-area single crystal diamond substrate in a short time and at a low cost using the technique disclosed in Japanese Patent Laying-Open Nos. 2011-195407 and 2012-86988.

According to Japanese Patent Laying-Open No. 2012-86988, improvements of the etching conditions are attempted. However, even when the etching conditions are improved, the etching time for the non-diamond layer is longer when the area of the used diamond seed substrate is larger. Thus, when the etching conditions for the non-diamond layer are only improved, it is still difficult to manufacture a large-area single crystal diamond substrate in a short time and at a low cost. Even when ion implantation conditions are improved to increase the thickness of the non-diamond layer, it is still difficult to manufacture a large-area single crystal diamond substrate in a short time and at a low cost. Moreover, a large-area polycrystal diamond has similar problems as well.

In view of these circumstances, it is an object to provide a method of manufacturing a diamond substrate that enables manufacture of a large-area single crystal or polycrystal diamond substrate in a short time and at a low cost, provide a diamond substrate obtained by such a manufacturing method, and provide a diamond composite substrate including such a diamond substrate.

Solution to Problem

A method of manufacturing a diamond substrate according to an aspect of the present invention includes: forming an ion implantation layer at a side of a main surface of a diamond seed substrate by implanting ions into the main surface of the diamond seed substrate; producing a diamond structure by growing a diamond growth layer by a vapor phase synthesis method on the main surface of the diamond seed substrate, after implanting ions; and performing heat treatment on the diamond structure. The performed heat treatment causes the diamond structure to be separated along the ion implantation layer into: a first structure including the diamond seed substrate and failing to include the diamond growth layer; and a diamond substrate including the diamond growth layer.

Advantageous Effects of Invention

Based on the foregoing, a diamond substrate having a large area can be manufactured in a short time and at a low cost.

DESCRIPTION OF EMBODIMENTS

Figure 1:
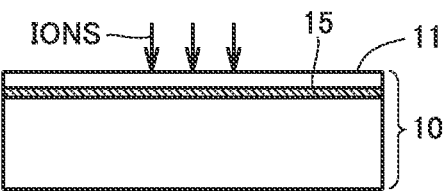
FIG. 1 shows cross-sectional views (A), (B), and (C) illustrating a method of manufacturing a diamond substrate in the present embodiment in order of steps.
Figure 1:
Figure 1:
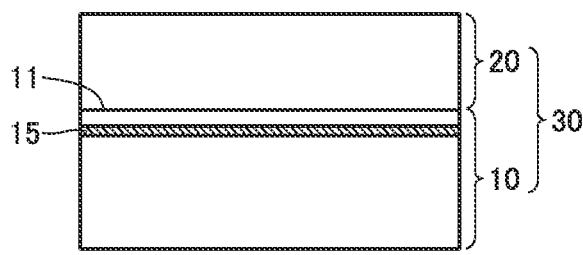
Figure 1:
Figure 1:
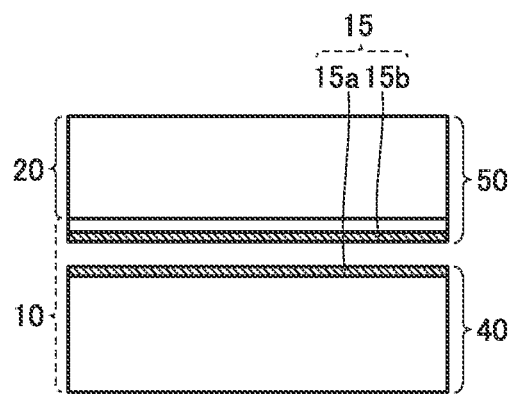

As described above, it is difficult for the technique disclosed in Japanese Patent Laying-Open Nos. 2011-195407 and 2012-86988 to manufacture a large-area single crystal diamond substrate (a single crystal diamond substrate having a diameter of 50.8 mm or more (two inches or more) for example) in a short time and at a low cost. The inventors of the present invention thus considered it is necessary to find a method of manufacturing a single crystal diamond substrate completely different from the method disclosed in Japanese Patent Laying-Open Nos. 2011-195407 and 2012-86988, in order to manufacture a large-area single crystal diamond substrate in a short time and at a low cost.

Japanese Patent Laying-Open Nos. 2006-210660 and 2011-61084 for example disclose a method of manufacturing a laminated substrate produced by laminating a nitride semiconductor film and a silicon substrate into the laminated substrate. Specifically, ions are implanted in the vicinity of a surface of the nitride semiconductor substrate. The silicon substrate is superposed on the surface of the nitride semiconductor substrate from which the ions are implanted, and thereafter heat treatment is performed. This heat treatment causes a part of the nitride semiconductor substrate to be parted together with the silicon substrate from the remaining bulk part of the nitride semiconductor substrate, along the layer formed of implanted ions (ion implantation layer). In this way, the aforementioned laminated substrate is obtained. The inventors of the present invention considered that the above-described method of manufacturing a laminated substrate can be used to manufacture a large-area single crystal diamond substrate in a short time and at a low cost. However, it had been considered difficult to manufacture a single crystal diamond substrate through heat treatment. In order to confirm this common technical knowledge, the inventors of the present invention implanted ions into a diamond seed substrate, grew a diamond layer on the surface of the diamond seed layer from which the ions were implanted, and thereafter performed heat treatment. Consequently, from some diamond seed substrates, a single crystal diamond substrate was detached along the ion implantation layer (such detachment of the diamond substrate is hereinafter referred to as "separation of diamond substrate"). However, in some diamond seed substrates, separation of a single crystal diamond substrate was not confirmed.

A reason for occurrence of the separation of the diamond substrate may be considered as follows. The heat treatment performed on the diamond seed substrate in which ions are implanted causes the ions to gather in a planar form in the ion implantation layer and form air bubbles. Accordingly, fine voids are formed to spread two-dimensionally in the ion implantation layer, resulting in separation of the diamond substrate.

Meanwhile, the inventors of the present invention examined in detail the diamond seed substrates where separation of the diamond substrate did not occur, and considered that separation of the diamond substrate did not occur for the following reasons.

A first reason is considered as transformation of diamond to graphite or amorphous carbon due to the ion implantation. When ions are implanted into the diamond seed substrate, diamond in the region where the ions are implanted may be transformed to graphite or amorphous carbon. In the region where diamond is transformed to graphite or amorphous carbon, at least a part of the ions implanted into the diamond seed substrate is fixed. When heat treatment is performed on such a diamond seed substrate, the implanted ions are difficult to diffuse in the ion implantation layer and therefore difficult to gather in a planar form. Accordingly, fine voids are difficult to form and spread two-dimensionally in the ion implantation layer. Because of this, separation of the diamond substrate is less likely to occur.

A second reason is considered as the strength of cohesion between carbon atoms forming a diamond crystal structure. The cohesion between carbon atoms forming the diamond crystal structure is known to be significantly strong. Therefore, depending on heat treatment conditions, bonds between carbon atoms forming the diamond crystal structure are difficult to sever and thus separation of the diamond substrate is less likely to occur. Moreover, even when the heat treatment conditions are changed so that the bonds between carbon atoms forming the diamond crystal structure are easily severed, the heat treatment may cause transformation of diamond to graphite or amorphous carbon. As a result of this, the crystal quality of the diamond substrate is deteriorated.

The inventors of the present invention further conducted studies intensively in view of the foregoing, and devised a method enabling a large-area single crystal or polycrystal diamond substrate to be manufactured in a short time and at a low cost.

[Description of Embodiments of the Invention]

First of all, aspects of the present invention will be described one by one.

[1] A method of manufacturing a diamond substrate according to an aspect of the present invention includes: forming an ion implantation layer at a side of a main surface of a diamond seed substrate by implanting ions into the main surface of the diamond seed substrate; producing a diamond structure by growing a diamond growth layer by a vapor phase synthesis method on the main surface of the diamond seed substrate, after implanting the ions; and performing heat treatment on the diamond structure. The performed heat treatment causes the diamond structure to be separated along the ion implantation layer into a first structure including the diamond seed substrate and failing to include the diamond growth layer, and a diamond substrate including the diamond growth layer. Thus, a diamond substrate with a large area can be manufactured in a short time and at a low cost.

"Diamond seed substrate" refers to a substrate which is used for manufacturing a diamond substrate and on which a diamond growth layer is to be grown.

"Diamond structure" includes the diamond seed substrate and the diamond growth layer formed on the main surface of the diamond seed substrate.

[2] Preferably, the ions include ions of one kind of atom selected from the group consisting of hydrogen atom, helium atom, nitrogen atom, oxygen atom, and argon atom. Thus, easy separation of the diamond substrate having an excellent crystal quality can be implemented.

[3] Preferably, the ions are implanted with an ion implantation energy of not less than 10 keV and not more than 500 keV to an ion implantation depth of not more than 3 µm. Thus, the diamond substrate can be separated easily.

[4] Preferably, the ions are implanted at a dose of not less than $1 \times 10^{16}$ cm$^{-2}$ and not more than $1 \times 10^{18}$ cm$^{-2}$. Thus, the diamond substrate can be separated easily.

[5] Preferably, the heat treatment is performed in one of an inert gas atmosphere containing oxygen gas at a concentration of not less than 10 ppm and not more than 1000 ppm, and a vacuum atmosphere at a vacuum of not less than $1 \times 10^{-8}$ Pa and not more than $1 \times 10^{-2}$ Pa containing oxygen gas at a partial pressure of not less than $1 \times 10^{-8}$ Pa and not more than $1 \times 10^{-5}$ Pa. Thus, the diamond substrate can be separated smoothly.

[6] Preferably, a nitrogen concentration at the main surface of the diamond seed substrate is not more than 100 ppm. Thus, the diamond substrate can be separated reliably.

[7] Preferably, the diamond seed substrate is grown by a vapor phase synthesis method. Thus, the diamond substrate can be separated reliably.

[8] The diamond seed substrate excluding the ion implantation layer may include a layer having a resistivity of not less than $10^{-5}$ Ω·cm and not more than $10^{9}$ Ω·cm. Alternatively, the diamond seed substrate may have a resistivity of not less than $10^{-5}$ Ω·cm and not more than $10^{9}$ Ω·cm. Even in such a case, the diamond substrate can be separated.

[9] The diamond seed substrate may be a single crystal and the diamond growth layer may be a single crystal. Even in such a case, the diamond substrate can be separated.

[10] The diamond seed substrate may be a polycrystal and the diamond growth layer may be a polycrystal. Even in such a case, the diamond substrate can be separated.

[11] Preferably, crystal grains in the polycrystal at the main surface of the diamond seed substrate have an average grain size of not less than 30 µm. Thus, easy separation of the polycrystal diamond seed substrate can be implemented.

[12] A diamond substrate according to an aspect of the present invention is manufactured in accordance with the method of manufacturing a diamond substrate according to an aspect of the present invention. The diamond substrate 50 manufactured in accordance with this method has a high crystal quality.

[13] A diamond substrate according to another aspect of the present invention is a diamond substrate of a single crystal. A photoluminescence spectrum of the diamond substrate includes: a first emission peak having an emission peak wavelength in a wavelength range of not less than 450 nm and not more than 650 nm; and a second emission peak having an emission peak wavelength in a wavelength range of not less than 570 nm and not more than 580 nm. The photoluminescence spectrum is obtained by applying, to the diamond substrate, excitation light having a peak wavelength in a wavelength range of not less than 315 nm and not more than 335 nm at a temperature in a temperature range of not less than 7 K and not more than 83 K. The first emission peak has a full width at half maximum of not less than 50 nm. The second emission peak has a full width at half maximum of not more than 10 nm. A peak height of the first emission peak is not less than 0.1 times (1/10 times) as high as a peak height of the second emission peak.

[14] A diamond substrate according to still another aspect of the present invention is a diamond substrate of a single crystal. An absorption spectrum of the diamond substrate with wavelength plotted on a horizontal axis and absorption coefficient plotted on a vertical axis includes a first absorption peak having an absorption peak wavelength in a wavelength range of not less than 265 nm and not more than 275 nm, and a second absorption peak having an absorption peak wavelength in a wavelength range of not less than 370 nm and not more than 390 nm. A peak height of the second absorption peak is lower than a peak height of the first absorption peak.

[15] A diamond substrate according to a further aspect of the present invention is a diamond substrate of a polycrystal. The diamond substrate is obtained by a vapor phase synthesis method, and crystal grains in the polycrystal of the diamond substrate have an average grain size of not less than 30 μm. [16] The diamond substrate may include a first surface and a second surface located opposite to the first surface. Concentration of first atoms at the second surface may be higher than a concentration of the first atoms at the first surface, the first atoms being different from atoms forming a diamond crystal structure. The concentration of the first atoms may decrease from the second surface toward an inside of the diamond substrate, in a thickness direction of the diamond substrate. The concentration of the first atoms at the second surface may be not less than 100 times as high as the concentration of the first atoms in the inside of the diamond substrate.

"First atoms different from atoms forming a diamond crystal structure" include not only atoms other than carbon atoms but also carbon atoms which do not form the diamond crystal structure. "First atoms at the second surface" do not include first atoms naturally adhering to the second surface.

[17] Preferably, in at least a part of the second surface, a mesh structure defined by a protrusion or depression with a height of not less than 1 nm and not more than 50 nm surrounding flat regions is formed. Preferably, the flat regions of the second surface each have a size of not less than 3 μm and not more than 30 μm. Thus, the diamond substrate can be used as a substrate to be mounted with a device.

"A protrusion or depression with a height of not less than 1 nm and not more than 50 nm" includes a protrusion with a height of not less than 1 nm and not more than 50 nm and a depression with a depth of not less than 1 nm and not more than 50 nm.

"Flat region" refers to a region where no protrusion with a height of 1 nm or more and no depression with a depth of 1 nm or more is formed. In other words, "flat region" includes not only a region where the protrusion/depression is not formed at all but also a region where at least one of a protrusion with a height of less than 1 nm and a depression with a depth of less than 1 nm is formed.

The "size of each of the flat regions of the second surface" refers to the diameter when the flat region of the second surface is circular in shape, or refers to a maximum dimension when the flat region has a shape different from the circular shape.

[18] Preferably, the second surface is a physically polished surface. Thus, the second surface is made planer sufficiently. "Physically polished" means that it is polished by a method different from polishing with a chemical (chemical polishing), and means that the surface is polished through cutting, wear, or deformation.

[19] Preferably, the diamond substrate has a thickness of not less than 100 μm and not more than 1500 μm. Thus, the diamond substrate can be used as a substrate to be mounted with a device.

[20] Preferably, the diamond substrate has a diameter of not less than 50.8 mm (two inches). Thus, the diamond substrate can be used as a substrate to be mounted with a device.

[21] The diamond substrate may include a layer having a resistivity of not less than $10^{-5}$ Ω·cm and not more than $10^9$ Ω·m. Alternatively, the diamond substrate may be a substrate having a resistivity of not less than $10^{-5}$ Ω·cm and not more than $10^9$ Ω·cm. Such a diamond substrate can be obtained by manufacturing the diamond substrate in accordance with the method of manufacturing a diamond substrate in an aspect of the present invention.

[22] A diamond composite substrate according to an aspect of the present invention includes: a diamond substrate according to an aspect of the present invention; and an epitaxial layer formed through epitaxial growth on at least one of a first surface of the diamond substrate and a second surface of the diamond substrate located opposite to the first surface.

[Details of Embodiments of the Invention]

Hereinafter, an embodiment of the present invention (hereinafter referred to as "present embodiment") will be further detailed. In the drawings, the same reference characters denote the same or corresponding parts. The relation between dimensions such as length, width, thickness, and depth is changed as appropriate for the sake of clarification and simplification of the drawings, and does not represent the actual dimensional relation.

[Method of Manufacturing Diamond Substrate]

FIG. 1 shows cross-sectional views (A), (B), and (C) illustrating a method of manufacturing a diamond substrate 50 in the present embodiment in order of steps.

The method of manufacturing a diamond substrate 50 in the present embodiment includes the steps of: forming an ion implantation layer 15 at a side of a main surface 11 of a diamond seed substrate 10 by implanting ions into main surface 11 of diamond seed substrate 10 (hereinafter also referred to as ion implantation step); producing a diamond structure 30 by growing a diamond growth layer 20 by a vapor phase synthesis method on main surface 11 of diamond seed substrate 10, after implanting the ions (hereinafter also referred to as diamond-growth-layer growth step); and performing heat treatment on diamond structure 30 (hereinafter also referred to as heat treatment step). In this way, the diamond substrate having a large area can be manufactured in a short time and at a low cost. The method of manufacturing diamond substrate 50 in the present embodiment is appropriately applied regardless of whether the diamond substrate is a single crystal or a polycrystal, except that the method is specially defined herein below.

A method of manufacturing a diamond substrate other than the above-described method in the present embodiment may include the steps of implanting ions into the main surface of the diamond seed substrate, forming an intermediate layer on the main surface of the diamond seed substrate after implanting ions, producing a diamond structure including the intermediate layer by growing a diamond growth layer on a main surface of the intermediate layer, and performing heat treatment on the diamond structure including the intermediate layer. However, in the case of such a manufacturing method producing the diamond structure including the intermediate layer, the diamond growth layer is epitaxially grown on the main surface of the intermediate layer of any material other than diamond (heteroepitaxial growth), and thus it is difficult to obtain the diamond growth layer having a high crystal quality. In contrast, in the case of the method of manufacturing a diamond substrate in the present embodiment, the diamond growth layer is epitaxially grown on the main surface of the diamond seed substrate without the intermediate layer interposed therebetween (homoepitaxial growth) after implanting ions, and thus the diamond growth layer having a high crystal quality is obtained.

If the seed substrate is any substrate other than diamond seed substrate, such as silicon seed substrate, germanium seed substrate, or gallium nitride seed substrate, the main surface in which ions are implanted has a significant damage to the crystal. Therefore, it is difficult to homoepitaxially grow a silicon growth layer, a germanium growth layer, and gallium nitride growth layer on respective main surfaces of the corresponding substrates. However, in the diamond seed substrate, the main surface in which ions are implanted under appropriate ion implantation conditions is hardly damaged and therefore, a diamond growth layer can be deposited on the main surface by homoepitaxial growth.

A reason for this is as follows. In diamond seed substrate 10, the strength of cohesive between carbon atoms forming the diamond crystal structure is considerably large. Therefore, even when ions are implanted, bonds between carbon atoms are difficult to sever and thus the main surface is hardly damaged. Therefore, separation of diamond seed substrate 10 requires a greater energy (higher temperature) as compared with the silicon seed substrate, the germanium seed substrate, and the gallium nitride seed substrate. It is therefore important to control ion implantation conditions, conditions for growing the diamond growth layer, and heat treatment conditions so that diamond seed substrate 10 will not be separated at the growth temperature or lower for growing diamond growth layer 20 after ion implantation, but diamond seed substrate 10 is separated along ion implantation layer 15 at the temperature of the subsequent heat treatment.

<Ion Implantation Step>

In the ion implantation step, ions are implanted into main surface 11 of diamond seed substrate 10. Accordingly, ion implantation layer 15 is formed at a side of main surface 11 of diamond seed substrate 10 (FIG. 1 (A)).

Diamond Seed Substrate

Diamond seed substrate 10 may be either a single crystal or a polycrystal. When a single crystal diamond substrate is to be manufactured, it is preferable to use a single crystal diamond seed substrate. When a polycrystal diamond substrate is to be manufactured, it is preferable to use a polycrystal diamond seed substrate. Single crystal diamond seed substrate 10 may for example be Type Ib diamond substrate, Type IIa diamond substrate, or a diamond substrate formed by the vapor phase synthesis method (CVD (Chemical Vapor Deposition) method for example). Polycrystal diamond seed substrate 10 may be a diamond substrate formed by the vapor phase synthesis method (CVD method for example).

When polycrystal diamond substrate 50 is to be manufactured by growing polycrystal diamond growth layer 20 by the vapor phase synthesis method on main surface 11 of polycrystal diamond seed substrate 10, the average grain size of crystal grains in the polycrystal of main surface 11 of diamond seed substrate 10 is preferably 30 μm or more, more preferably 60 μm or more, and still more preferably 90 μm or more, in order to make it easy to separate diamond substrate 50 including the grown diamond growth layer 20. In ion implantation layer 15 formed at a side of main surface 11 of polycrystal diamond seed substrate 10, the heat treatment as will be described later herein causes ions to be gasified to generate air bubbles. However, at grain boundaries, air bubble growth is stopped due to trapping of ions and/or gas leakage. Therefore, if the average grain size of crystal grains in the polycrystal of main surface 11 of diamond seed substrate 10 is larger than 30 μm, the air bubble diameter is large enough, the air bubble density is high enough, and the gas dissociation pressure is large enough to make it easy to separate diamond substrate 50. The average grain size of crystal grains in the polycrystal of main surface 11 of diamond seed substrate 10 is observed with an SEM (Scanning Electron Microscope). "Average grain size of crystal grains" herein refers to the average grain size of crystal grains appearing on the main surface. As to how to calculate the average grain size, the number of crystal grains within a measurement range is counted, the total area of the measurement range is divided by the number of crystal grains to determine the area per crystal grain, and the radius is calculated supposing that the crystal grains are circular in shape to define the average crystal grain size as the determined value of the radius.

The nitrogen concentration of main surface 11 of diamond seed substrate 10 is preferably 100 ppm or less, more preferably 80 ppm or less, still more preferably 10 ppm or less, further preferably 5 ppm or less, and particularly preferably 0.1 ppm or less. Accordingly, it is possible to effectively prevent transformation of diamond seed substrate 10 to graphite or amorphous carbon due to ion implantation. Thus, through heat treatment as described later herein, diamond structure 30 (FIG. 1 (B)) is easily divided along ion implantation layer 15 into a first structure 40 which includes diamond seed substrate 10 and does not include diamond growth layer 20, and diamond substrate 50 which includes diamond growth layer 20 (FIG. 1 (C)). The division of diamond structure 30 into first structure 40 and diamond substrate 50 along ion implantation layer 15 is hereinafter referred to as "separation of diamond substrate 50."

If transformation of diamond seed substrate 10 to graphite or amorphous carbon due to ion implantation can be prevented effectively, diamond substrate 50 can be separated without raising the heat treatment temperate to an extremely high temperature for the heat treatment as will be described later herein. Thus, transformation of diamond growth layer 20 to graphite or amorphous carbon due to the heat treatment can be prevented. Moreover, if it is unnecessary to raise the heat treatment temperature to an extremely high temperature for the heat treatment, separation of diamond substrate 50 occurs reliably. Accordingly, diamond substrate 50 can be manufactured without causing generation of cracks. For the above-described reasons, diamond substrate 50 excellent in crystal quality can be manufactured.

It is practically preferable to use diamond seed substrate 10 having a nitrogen concentration of 5 ppm or less at main surface 11. In this case, diamond substrate 50 can be separated more easily by the heat treatment as will be described later herein (FIG. 1 (C)), and diamond substrate 50 more excellent in crystal quality can be manufactured. Diamond seed substrate 10 having a nitrogen concentration of less than 1 ppm is difficult to obtain. However, as long as the nitrogen concentration at main surface 11 is not less than 1 ppm and not more than 5 µm, diamond substrate 50 can be separated still more easily by the heat treatment. Thus, diamond seed substrate 10 having a nitrogen concentration at main surface 11 of not less than 1 ppm and not more than 5 ppm is appropriately used.

In the Type Ib diamond substrate mentioned above as an example of single crystal diamond seed substrate 10, there is a large variation in the nitrogen concentration in main surface 11. Usually, this nitrogen concentration is 3 ppm to 100 ppm, preferably on the order of 3 ppm to 80 ppm, while some such diamond seed substrates have a maximum nitrogen concentration higher than 100 ppm. It is preferable to use a Type Ib diamond substrate having a nitrogen concentration of 100 ppm or less at main surface 11, in order to prevent generation of cracks. The Type Ib diamond substrate as an example of single crystal diamond seed substrate 10 has a nitrogen concentration at main surface 11 of not more than 10 ppm, preferably not more than 0.1 ppm. Moreover, a structure (hereinafter referred to as "CVD diamond substrate") obtained by growing a diamond layer by the CVD (Chemical Vapor Deposition) method, which is one of vapor phase synthesis methods, on the upper surface of a Type Ib diamond substrate instead of Type IIa diamond substrate may be used. The CVD diamond substrate can be used as diamond seed substrate 10 to provide diamond seed substrate 10 at a low price, and thus effectively reduce the cost for manufacturing diamond substrate 50. When the CVD diamond substrate is used as diamond seed substrate 10, the nitrogen concentration at the main surface of the diamond layer grown by the CVD method is 5 ppm or less. Therefore, it is preferable to implant ions into the diamond layer grown by the CVD method.

In a CVD diamond substrate, which is mentioned as an example of polycrystal diamond seed substrate 10, obtained by the CVD method as a kind of vapor phase synthesis method, the nitrogen concentration at the main surface of the diamond layer grown by the CVD method is 5 ppm or less. It is thus preferable to implant ions into the diamond layer grown by the CVD method.

Accordingly, the nitrogen concentration at main surface 11 of diamond seed substrate 10 is preferably 100 ppm or less, more preferably 80 ppm or less, still more preferably 10 ppm or less, particularly preferably 5 ppm or less, and most preferably 0.1 ppm or less.

Diamond seed substrate 10 may have a uniform nitrogen concentration or non-uniform nitrogen concentration. A region in diamond seed substrate 10 with no implanted ions in the region (a region which is a part of diamond seed substrate 10 and located opposite to main surface 11, for example) may have a nitrogen concentration of 100 ppm or less or more than 100 ppm. The nitrogen concentration at main surface 11 of diamond seed substrate 10 is herein measured by SIMS (secondary ion mass spectrometry).

Preferably, diamond seed substrate 10 is grown by a vapor phase synthesis method. The vapor phase synthesis method is not particularly limited. However, in order to reduce the nitrogen concentration at main surface 11, CVD (Chemical Vapor Deposition) method, more specifically microwave plasma CVD method, hot filament CVD method, or the like is preferred. Such a vapor phase synthesis method can be used to prevent generation of cracks and separate diamond reliably.

The resistivity of diamond seed substrate 10 is not particularly limited. According to the method disclosed for example in Japanese Patent Laying-Open No. 2011-195407, the non-diamond layer is an electrically conductive layer and is electrochemically etched (electrolytic etching) in a subsequent step. Therefore, if an electrically conductive substrate is used as a substrate into which ions are implanted, the electrolytic etching for the ion implantation layer is not effectively performed. Thus, the electrically conductive substrate cannot be used as a substrate in which ions are implanted.

Regarding the method in the present embodiment to perform heat treatment after ion implantation, the heat treatment described later herein causes implanted ions to gather in a planar form in the ion implantation layer 15 and form air bubbles. Accordingly, separation of diamond substrate 50 occurs. Thus, regardless of whether diamond seed substrate 10 is an electrically conductive substrate or insulating substrate, diamond substrate 50 can be separated. For example, even when diamond seed substrate 10 excluding ion implantation layer 15 includes a layer having a resistivity of not less than $10^{-5}$ $\Omega$·cm and not more than $10^{-2}$ $\Omega$·cm to exhibit electrical conductivity, a resistivity of not less than $10^6$ $\Omega$·cm and not more than $10^9$ $\Omega$·cm to exhibit electrical insulation, or a resistivity between them, or even when the whole diamond seed substrate 10 including ion implantation layer 15 has a resistivity of not less than $10^{-5}$ $\Omega$·cm and not more than $10^{-2}$ $\Omega$·cm to exhibit electrical conductivity, a resistivity of not less than $10^6$ $\Omega$·cm and not more than $10^9$ $\Omega$·cm to exhibit electrical insulation, or a resistivity between them, diamond substrate 50 can be separated. As mentioned above, the resistivity of the diamond seed substrate is not particularly limited in terms of both electrical insulation and electrical conductivity, the resistivity is set to not less than $10^{-5}$ $\Omega$·cm and not more than $10^9$ $\Omega$·cm as a range for practical production of a single crystal or polycrystal diamond. The resistivity can be measured by the four-probe method or the four-terminal method. When the resistivity is measured by the four-terminal method, it is preferable to use an electrode formed of a Ti/Pt/Au multilayer structure as an electrode.

While main surface 11 of diamond seed substrate 10 is preferably a surface having plane orientation (001), the main surface may be a surface having an off angle of 5 degrees or less to plane orientation (001).

The thickness of diamond seed substrate 10 is not particularly limited, and is preferably not less than 50 µm and not more than 1000 µm, and more preferably not less than 200 µm and not more than 500 µm.

Ion Implantation Conditions

The growth temperature for diamond growth layer 20 is very high as described above. Therefore, during growth of diamond growth layer 20, separation may start locally in diamond seed substrate 10 in which ions are implanted, and cracks may be generated. In this case, it may be impossible to neatly detach diamond growth layer 20 from ion implantation layer 15 after forming diamond substrate 50. In view of this, in order to avoid the start of the separation at or less than the growth temperature for diamond growth layer 20, it is preferable to define ion implantation conditions under which diamond bonds are not severed, and to select, as atoms for ion implantation, atoms which have a small atomic radius and thus do not sever carbon bonds or atoms which have high affinity with carbon and thus high tendency to combine with carbon.

While the ions to be implanted into diamond seed substrate 10 are not particularly limited, it is preferable to use ions of first atoms which are different from atoms forming a diamond crystal structure, and it is more preferable that the ions include ions of one kind of atom selected from the group consisting of hydrogen atom, helium atom, nitrogen atom, oxygen atom, and argon atom, which are to form gas in the form of atoms or molecules. In this way, transformation of diamond seed substrate 10 to graphite or amorphous carbon due to ion implantation can be prevented effectively. Accordingly, as described above, the heat treatment described later herein can be performed to easily separate diamond substrate 50 and to manufacture diamond substrate 50 which is excellent in crystal quality.

More preferably, the first atoms are atoms of a light element such as hydrogen or helium. Then, transformation of diamond seed substrate 10 to graphite or amorphous carbon due to ion implantation can be prevented more effectively. Accordingly, the heat treatment described later herein can be performed to separate diamond substrate 50 more easily and to manufacture diamond substrate 50 which is more excellent in crystal quality. The method to implant ions of the first atoms into diamond seed substrate 10 may be any method known as an ion implantation method, without being limited to a specific method.

The ion implantation energy is preferably not less than 10 keV and not more than 500 keV. With an ion implantation energy of not less than 10 keV, it is possible to prevent an excessively short ion implantation depth (the distance between main surface 11 and a position in diamond seed substrate 10 at which the concentration of implanted ions is highest, corresponding to the average projected range obtained by simulation). Under this condition, it is possible to prevent damage to main surface 11 of diamond seed substrate 10 due to implanted ions (such as deterioration of the crystal quality of main surface 11 for example). On main surface 11 of diamond seed substrate 10, diamond growth layer 20 is formed (FIG. 1 (B)). Therefore, as long as damage to main surface 11 of diamond seed substrate 10 can be prevented, the crystal quality of diamond growth layer 20 can be enhanced and thus diamond substrate 50 excellent in crystal quality can be manufactured.

With an ion implantation energy of not more than 500 keV, it is possible to prevent an excessively large variation of ions (implanted ions) in the thickness direction of diamond seed substrate 10 (this variation is represented by the standard deviation of the projected range, hereinafter referred to as "variation in the ion implantation depth"), and thus prevent an excessively low ion density in ion implantation layer 15. Under this condition, the heat treatment described later herein can be performed to cause the implanted ions to effectively gather in a planar form in ion implantation layer 15. Moreover, with an ion implantation energy of not more than 500 keV, transformation of diamond seed substrate 10 to graphite or amorphous carbon due to ion implantation can be prevented effectively. Under these conditions, the heat treatment can be performed to easily separate diamond substrate 50. The ion implantation energy is more preferably not less than 50 keV and not more than 200 keV.

The ion implantation dose is preferably not less than $1 \times 10^{16}$ cm$^{-2}$ and not more than $1 \times 10^{18}$ cm$^{-2}$. With an ion implantation dose of not less than $1 \times 10^{16}$ cm$^{-2}$, ions of an amount of necessary for separating diamond substrate 50 by the heat treatment described later herein are implanted into diamond seed substrate 10. Then, the heat treatment can be performed to easily separate diamond substrate 50.

With an ion implantation dose of not more than $1 \times 10^{18}$ cm$^{-2}$, transformation of diamond seed substrate 10 to graphite or amorphous carbon due to ion implantation can effectively be prevented. Under this condition, as described above, the heat treatment described later herein can be performed to easily separate diamond substrate 50, and manufacture diamond substrate 50 which is excellent in crystal quality. The ion implantation dose is more preferably not less than $5 \times 10^{16}$ cm$^{-2}$ and not more than $5 \times 10^{17}$ cm$^{-2}$.

The ion implantation depth is preferably 3 μm or less. The variation in the ion implantation depth is preferably 0.1 μm or less. Under these conditions, diamond substrate 50 can be separated easily and reliably. In view of the above, it is preferable to set the ion implantation conditions in the above-described manner.

<Diamond-Growth-Layer Growth Step>

In the diamond-growth-layer growth step after the ion implantation step, diamond growth layer 20 is grown by the vapor phase synthesis method on main surface 11 of diamond seed substrate 10. By the vapor phase deposition method, diamond growth layer 20 of a single crystal is epitaxially grown on main surface 11 of diamond seed substrate 10 of a single crystal, or diamond growth layer 20 of a polycrystal is epitaxially grown on main surface 11 of the diamond seed substrate of a polycrystal. In this way, diamond structure 30 of a single crystal or a polycrystal can be produced.

An example of the vapor phase synthesis method may be the CVD method. As conditions for the vapor phase synthesis method, conditions known as conditions for forming a diamond layer by the CVD method can be used without being limited to specific conditions. An example method may be the following method. Methane and hydrogen are used as raw material gas, and the raw material gas is reacted in a plasma to deposit the reactant (diamond) on main surface 11 of diamond seed substrate 10 heated to approximately 900 to 1100° C.

The resistivity of diamond structure 30 may be defined similarly to the resistivity of diamond seed substrate 10. In other words, diamond structure 30 excluding ion implantation layer 15 may include a layer having a resistivity of not less than $10^{-5}$ Ω·cm and not more than $10^{-2}$ Ω·cm to exhibit electrical conductivity, a resistivity of not less than $10^6$ Ω·cm and not more than $10^9$ Ω·cm to exhibit electrical insulation, or a resistivity between them. Alternatively, the whole diamond structure 30 including ion implantation layer 15 may have a resistivity of not less than $10^{-5}$ Ω·cm and not more than $10^{-2}$ Ω·cm to exhibit electrical conductivity, a resistivity of not less than $10^6$ Ω·cm and not more than $10^9$ Ω·cm to exhibit electrical insulation, or a resistivity between them. In any case, the heat treatment described below can be performed to separate diamond substrate 50.

<Heat Treatment Step>

In the heat treatment step after the diamond-growth-layer growth step, the heat treatment is performed on diamond structure 30. This heat treatment causes the implanted ions to gather in a planar form in ion implantation layer 15 and form air bubbles.

Figure 2:
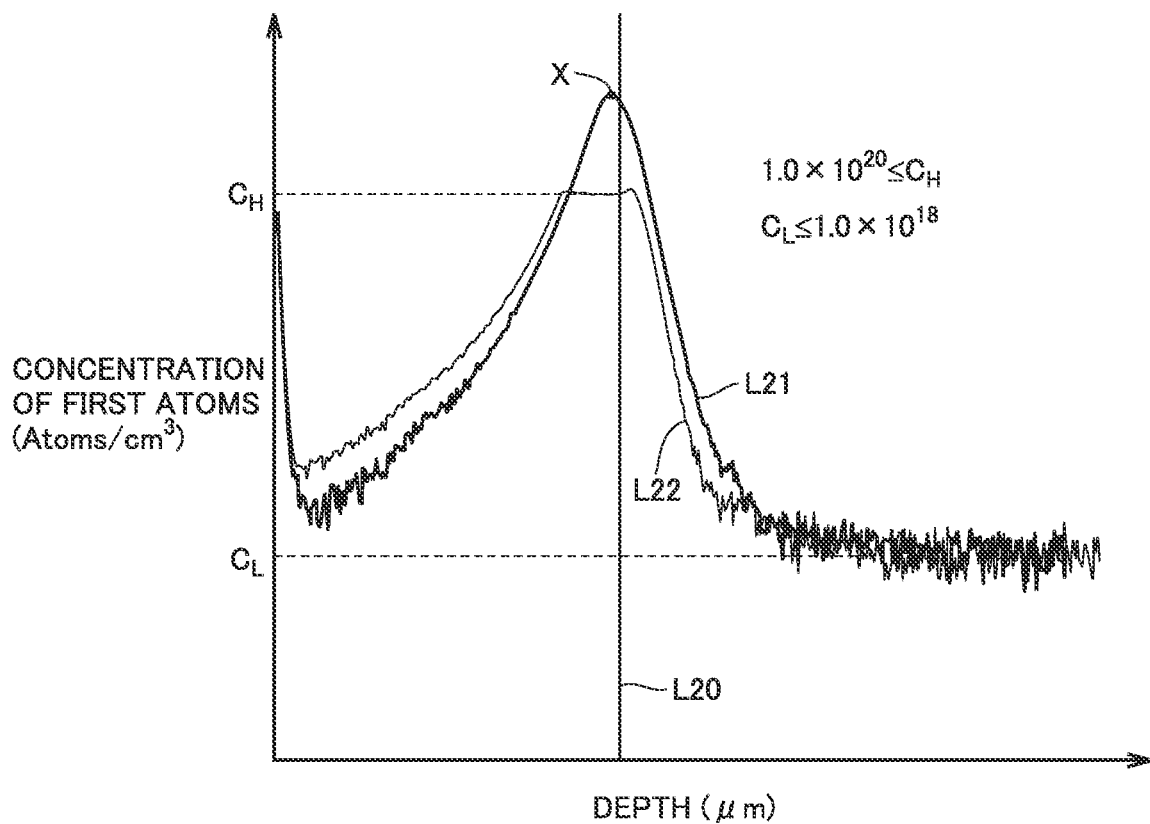
FIG. 2 shows a graph for results of measurement, by secondary ion mass spectrometry, of a concentration distribution of first atoms in the vicinity of an ion implantation layer before separation of a diamond substrate.

FIG. 2 shows the results of measurement, by SIMS, of the concentration distribution of first atoms (hydrogen atoms in this case) in the vicinity of ion implantation layer 15 before separation of diamond substrate 50 occurs. In FIG. 2, on the left side of L20, the concentration of first atoms at a side of ion implantation layer 15 in the region which is to form a first structure 40 is shown and, on the right side of L20, the concentration of first atoms at a side of ion implantation layer 15 in the region which is to form diamond substrate 50 is shown. L21 represents the concentration distribution of first atoms after the hydrogen ion implantation and before the heat treatment, and L22 represents the concentration distribution of first atoms after the heat treatment. SIMS is used to measure the concentration distribution of first atoms. It is considered that, in diamond structure 30, ions of first atoms are distributed as indicated by the concentration distribution shown in FIG. 2. The concentration distributions of first atoms in diamond structure 30 (namely first structure 40 and diamond substrate 50) before the heat treatment and after the heat treatment as shown in FIG. 2 are substantially common to diamond structure 30 of a single crystal and diamond structure 30 of a polycrystal.

Before the heat treatment, the concentration distribution of first atoms had a peak including a vertex X (L21). However, after the heat treatment, the shape of the concentration distribution of first atoms changed to a shape with a section in the vicinity of vertex X cut off, and thus the maximum value of the concentration of first atoms decreased (L22). Based on the above, it is considered that the heat treatment is performed to cause the implanted ions to gather in a planar form in ion implantation layer 15 and form air bubbles (ions are eliminated).

When the implanted ions gather in a planar form in ion implantation layer 15 to form air bubbles, fine voids spread two-dimensionally in ion implantation layer 15, and accordingly diamond substrate 50 is separated. Namely, ion implantation layer 15 is divided into a first ion implantation layer 15a and a second ion implantation layer 15b and consequently diamond structure 30 is divided into first structure 40 and diamond substrate 50 (FIG. 1 (C)). In this way, diamond substrate 50 is manufactured.

The heat treatment is considered as causing ions to gather and form air bubbles at a plurality of sites simultaneously in ion implantation layer 15. Ion implantation layer 15 is formed in parallel with main surface 11 of diamond seed substrate 10 (FIG. 1 (A)). Therefore, the separation time of diamond substrate 50 (the time taken to separate diamond substrate 50) does not depend on the size of diamond substrate 50. Namely, even a diamond substrate 50 having a large area (a single crystal diamond substrate having a diameter of 50.8 mm (two inches) or more or a polycrystal diamond substrate having a diameter of 152.4 mm (six inches) or more, for example) is to be manufactured, diamond substrate 50 can be separated in a short time and thus can be manufactured in a short time and at a low cost. The inventors of the present invention confirmed that even a single crystal diamond substrate with a small area (a single crystal diamond substrate of 4 mm×4 mm for example) can be manufactured in a shortened time in accordance with the method of manufacturing diamond substrate 50 in the present embodiment, relative to a single crystal diamond substrate with a small area manufactured in accordance with the method disclosed for example in Japanese Patent Laying-Open No. 2011-195407 (Example described later herein).

The separated surface of first structure 40 (upper surface in FIG. 1 (C)) can be chemically or physically polished to reuse first structure 40 as diamond seed substrate 10. Moreover, since the ion implantation depth is preferably 3 µm or less, the part of diamond seed substrate 10 to be lost when diamond substrate 50 is manufactured can be made small. Under these conditions, the number of diamond substrates 50 manufactured from one diamond seed substrate 10 can be increased and accordingly the cost for manufacturing diamond substrate 50 can further be reduced.

Heat Treatment Conditions

The heat treatment temperature is preferably not less than 1000° C. and not more than 2000° C. With a heat treatment temperature of not less than 1000° C., implanted ions easily gather in a planar form in ion implantation layer 15 and easily form air bubbles. Thus, fine voids are easily formed to spread two-dimensionally in ion implantation layer 15. Moreover, with a heat treatment temperature of not less than 1000° C., bonds between carbon atoms forming the diamond crystal structure are easily severed. Under these conditions, separation of diamond substrate 50 is facilitated.

Further, with a heat treatment temperature of not less than 1000° C., the heat treatment can be performed at a temperature higher than the growth temperature for diamond growth layer 20. Thus, the method of manufacturing diamond substrate 50 in the present embodiment according to which diamond growth layer 20 is grown and thereafter heat treatment is performed to separate diamond substrate 50 can be carried out.

With a heat treatment temperature of not more than 2000° C., transformation of diamond structure 30 to graphite or amorphous carbon due to the heat treatment can be prevented. Thus, diamond substrate 50 excellent in crystal quality can be manufactured. The heat treatment temperature is more preferably not less than 1200° C. and not more than 1500° C.

The heat treatment temperature is still more preferably not more than 1400° C. Under this condition, not only when a Type IIa diamond substrate is used as single crystal diamond seed substrate 10, but also when a Type Ib diamond substrate is used as single crystal diamond seed substrate 10, single crystal diamond substrate 50 can be separated.

Unless the heat treatment temperature is a critical temperature or more (the temperature at which bonds between carbon atoms forming the diamond crystal structure can be severed), diamond substrate 50 is not separated. When the heat treatment temperature is the critical temperature or more, the heat treatment temperature and the heat treatment time (the time for which the temperature of diamond structure 30 is kept at the above-described heat treatment temperature) can be used to calculate the activation energy necessary for separating diamond substrate 50. Therefore, whether diamond substrate 50 can be separated or not is determined depending on both the heat treatment temperature and the heat treatment time. When the heat treatment temperature is high, diamond substrate 50 is separated even if the heat treatment time is short. In contrast, when the heat treatment temperature is the critical temperature or more but the heat treatment temperature is not sufficiently high, the heat treatment time has to be extended to separate diamond substrate 50.

When the heat treatment time is less than five minutes, separation of diamond substrate 50 may not reliably occur due to a variation of the anneal furnace or heat-treated samples. On the contrary, when the heat treatment time is longer than 10 hours, the cost for separation of diamond substrate 50 is high, resulting in difficulty in mass production of diamond substrate 50. The heat treatment time is therefore preferably not less than 5 minutes and not more than 10 hours, and the heat treatment time is preferably set in consideration of the heat treatment temperature as described above.

The heat treatment is preferably performed in an inert gas atmosphere or a vacuum atmosphere at $1 \times 10^{-2}$ Pa or less. When the heat treatment is performed in an inert gas atmosphere, transformation of diamond structure 30 to graphite or amorphous carbon due to heat treatment can be prevented. "Inert gas" herein may be noble gas such as helium, neon, or argon, may be nitrogen gas, or may be a mixture of noble gas and nitrogen gas. When the heat treatment is performed in a vacuum at $1 \times 10^{-2}$ Pa or less, transformation of diamond structure 30 to graphite or amorphous carbon due to the heat treatment can be prevented.

In the heat treatment atmosphere, the presence of even a small amount of oxygen causes transformation of diamond to graphite or amorphous carbon. Therefore, oxygen has not been regarded as a material to be fed when the heat treatment is performed at 1000° C. or more. However, in the heat treatment step, an extra non-diamond layer in a region to be divided may not be sufficiently removed to hinder the separation of the diamond substrate and cause breakage. In view of this, it has been found that a tiny amount of oxygen gas or a tiny amount of gas containing oxygen atoms can be fed during the heat treatment to eliminate the factor hindering the separation and thereby smoothly separate the diamond substrate. If the amount of the oxygen gas or the gas containing oxygen atoms is excessively large, diamond is transformed to graphite or amorphous carbon. If this amount is excessively small, the non-diamond layer such as graphite layer or amorphous carbon layer hindering the separation cannot be removed. Therefore, the concentration of the oxygen gas in the inert gas atmosphere is preferably not less than 10 ppm and not more than 1000 ppm and more preferably not less than 20 ppm and not more than 100 ppm. While the pressure in the inert gas atmosphere is not particularly limited, this pressure is preferably at least a vacuum pressure and at most 4 GPa. Since high-pressure annealing requires a high cost, the pressure is preferably at least a vacuum pressure and at most an atmospheric pressure for the sake of enabling reduction of the cost. While the vacuum pressure herein is not particularly limited, the vacuum pressure is preferably not less than $1 \times 10^{-8}$ Pa and not more than $1 \times 10^{-2}$ Pa. Moreover, the partial pressure of the oxygen gas in the vacuum atmosphere at not less than $1 \times 10{-8}$ Pa and not more than $1 \times 10^{-2}$ Pa is preferably not less than $1 \times 10^{-8}$ Pa and not more than $1 \times 10^{-5}$ Pa, and more preferably not less than $1 \times 10^{-8}$ Pa and not more than $1 \times 10^{-7}$ Pa.

[Structure of Diamond Substrate]

In the following, a description will be given of diamond substrate 50 manufactured in accordance with the (above-described) method of manufacturing diamond substrate 50 in the present embodiment. Diamond substrate 50 manufactured by the above-described method has a high crystal quality. As long as diamond substrate 50 in the present embodiment has the structure and characteristics described below, diamond substrate 50 may be a diamond substrate manufactured in accordance with a different method from the above-described method.

Figure 3:
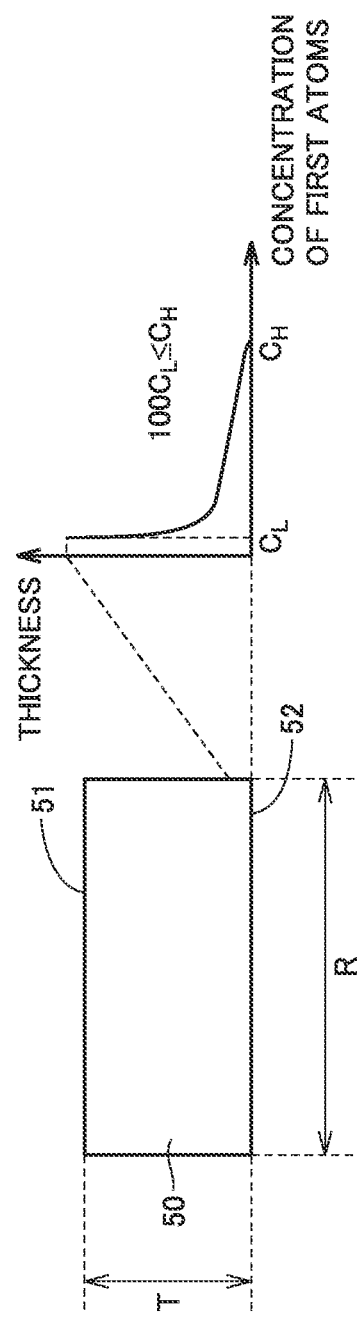
FIG. 3 shows a cross-sectional view of a diamond substrate in the present embodiment and a schematic diagram of a concentration distribution of first atoms in a relevant part of the diamond substrate.

FIG. 3 shows a cross-sectional view of diamond substrate 50 and a schematic diagram of a concentration distribution of first atoms in a relevant part of diamond substrate 50. Diamond substrate 50 has a first surface (upper surface) 51 and a second surface (lower surface) 52 located opposite to the first surface. Preferably, diamond substrate 50 has a thickness T of not less than 100 μm and not more than 1500 μm, and has a diameter R of not less than 50.8 mm (not less than two inches). Further, diamond substrate 50 of a single crystal has a diameter R of preferably not less than 101.6 mm (four inches in diameter), more preferably not less than 152.4 mm (six inches in diameter). Then, diamond substrate 50 can be used as a substrate to be mounted with a device, and the substrate to be mounted with a device can therefore be manufactured in a short time and at a low cost. Preferably, diamond substrate 50 further has at least one of the following characteristics.

Concentration Distribution of First Atoms

First surface 51 is a surface formed by growth of diamond growth layer 20. Second surface 52 is a surface formed by separation of diamond substrate 50. Therefore, concentration CH of first atoms at second surface 52 is higher than the concentration of first atoms at first surface 51. As described above, actually ions of first atoms are distributed in diamond substrate 50 as illustrated below. The distribution of first atoms as illustrated below is common to single crystal diamond substrate 50 and polycrystal diamond substrate 50.

Specifically, in diamond substrate 50, the concentration of first atoms decreases from second surface 52 toward the inside of diamond substrate 50 in the direction of thickness T of diamond substrate 50. Moreover, concentration $C_H$ of first atoms at second surface 52 is not less than 100 times as high as concentration $C_L$ of first atoms in the inside of diamond substrate 50 (FIG. 2). For example, concentration $C_H$ of first atoms at second surface 52 of diamond substrate 50 is not less than $1 \times 10^{20}$ cm$^{-3}$, and concentration $C_L$ of first atoms in the inside of diamond substrate 50 is not more than $1 \times 10^{18}$ cm$^{-3}$.

"First atoms at second surface 52" herein refer to first atoms implanted into second surface 52 by ion implantation. Therefore, "first atoms at second surface 52" do not include first atoms naturally adhering to the second surface (as described above) and do not include first atoms taken into the second surface from the atmosphere with which the second surface is in contact. The first atoms taken into the second surface from the atmosphere with which the second surface is in contact are only present at a depth on the order of several nm from the second surface.

Flatness of Second Surface

When diamond substrate 50 is manufactured by the above-described method, namely by performing heat treatment on the ion implantation layer to generate many fine air bubbles and cause diamond substrate 50 to be separated by the gas dissociation pressure of the air bubbles, the formed air bubbles generate flat regions and a protrusion/depression having a height of not less than 1 nm and not more than 50 nm is formed around each of the flat regions, and the region of the protrusion/depression is a region which has been forced to be separated. Thus, a mesh structure is formed. When the size of the air bubbles is less than 3 μm, the gas dissociation pressure required to separate diamond substrate 50 cannot be obtained. When the size of the air bubbles is more than 30 μm, the air bubble regions are partially separated, however, due to a lower density of the air bubbles, the region around the air bubbles is accordingly larger and diamond substrate 50 is difficult to separate. Therefore, preferably the flat regions each have a size of not less than 3 μm and not more than 30 μm.

When diamond substrate 50 is manufactured following the above-described method, second ion implantation layer 15b (FIG. 1 (C)) may be present in second surface 52 of diamond substrate 50, and a graphite region or amorphous carbon region formed by the above-described heat treatment may be present in second surface 52.

Since the ion implantation depth is preferably 3 μm or less, second surface 52 of diamond substrate 50 is considered as relatively flat. In view of the above, it is considered that second surface 52 can be chemically polished to remove second ion implantation layer 15b or the like from second surface 52 to use diamond substrate 50 as a substrate to be mounted with a device. The method of chemically polishing second surface 52 may be a method to chemically polish second surface 52 with hot mixed acid. "Chemical polishing with hot mixed acid" herein refers to etching at 200° C. with nitric acid:sulfuric acid=1:3 (volume ratio).

Before the chemical polishing with hot mixed acid, a protrusion having a height on the order of 100 nm or a depression having a depth on the order of 100 nm is present in second surface 52. The protrusion/depression is considered as being generated due to second ion implantation layer 15b or a graphite region or amorphous carbon region or the like formed by the heat treatment as described above.

However, when the chemical polishing with hot mixed acid is performed, second ion implantation layer 15b and the graphite region and the amorphous carbon region or the like formed by the heat treatment are removed, and accordingly second surface 52 has an arithmetic mean roughness Ra of 5 nm to 50 nm.

In addition, after the chemical polishing with hot mixed acid is performed, a mesh structure is present in at least a part of second surface 52. The mesh structure is defined by a protrusion/depression having a height of not less than 1 nm and not more than 50 nm and surrounding each of flat regions. The flat regions at second surface 52 each have a size L of not less than 3 μm and not more than 30 μm. Namely, by the chemical polishing with hot mixed acid, the non-diamond layer formed by the heat treatment is removed to generate the mesh structure with the lessened protrusion/depression. A reason why such a mesh structure is formed at second surface 52 may be as follows. This mesh structure is present in at least a part of second surface 52 of diamond substrate 50 of either a single crystal or a polycrystal, after the chemical polishing.

In the regions generated by air bubbles which are formed by ions gathered through the heat treatment, separation of diamond substrate 50 spontaneously occurs. Therefore, after second surface 52 is chemically polished with hot mixed acid, flat regions are formed at second surface 52.

Meanwhile, in the region where ions are difficult to gather even by the heat treatment, diamond substrate 50 is forced to be separated. Therefore, after second surface 52 is chemically polished with hot mixed acid, a protrusion/depression with a height of not less than 1 nm and not more than 50 nm is formed. The protrusion/depression of second surface 52 is measured with an AFM (Atomic Force Microscope) or confocal laser microscope.

Even when such a mesh structure is formed in second surface 52 of diamond substrate 50, this diamond substrate 50 can be used as a substrate to be mounted with a device. Since second surface 52 can be chemically polished to manufacture the substrate to be mounted with a device, without physically polishing second surface 52, the substrate to be mounted with a device can be manufactured at a low cost and in a short time.

Further, preferably second surface 52 is physically polished. Second surface 52 can be physically polished to further lessen the protrusion/depression. Thus, diamond substrate 50 with second surface 52 physically polished can be used as a freestanding substrate.

Since first surface 51 is a surface formed by growth of diamond growth layer 20, first surface 51 has a larger arithmetic mean roughness than second surface 52 before polished. It is therefore preferable to physically polish first surface 51 by laser-beam machining, slicing, or polishing or the like.

Light Emission Characteristics

Figure 4:
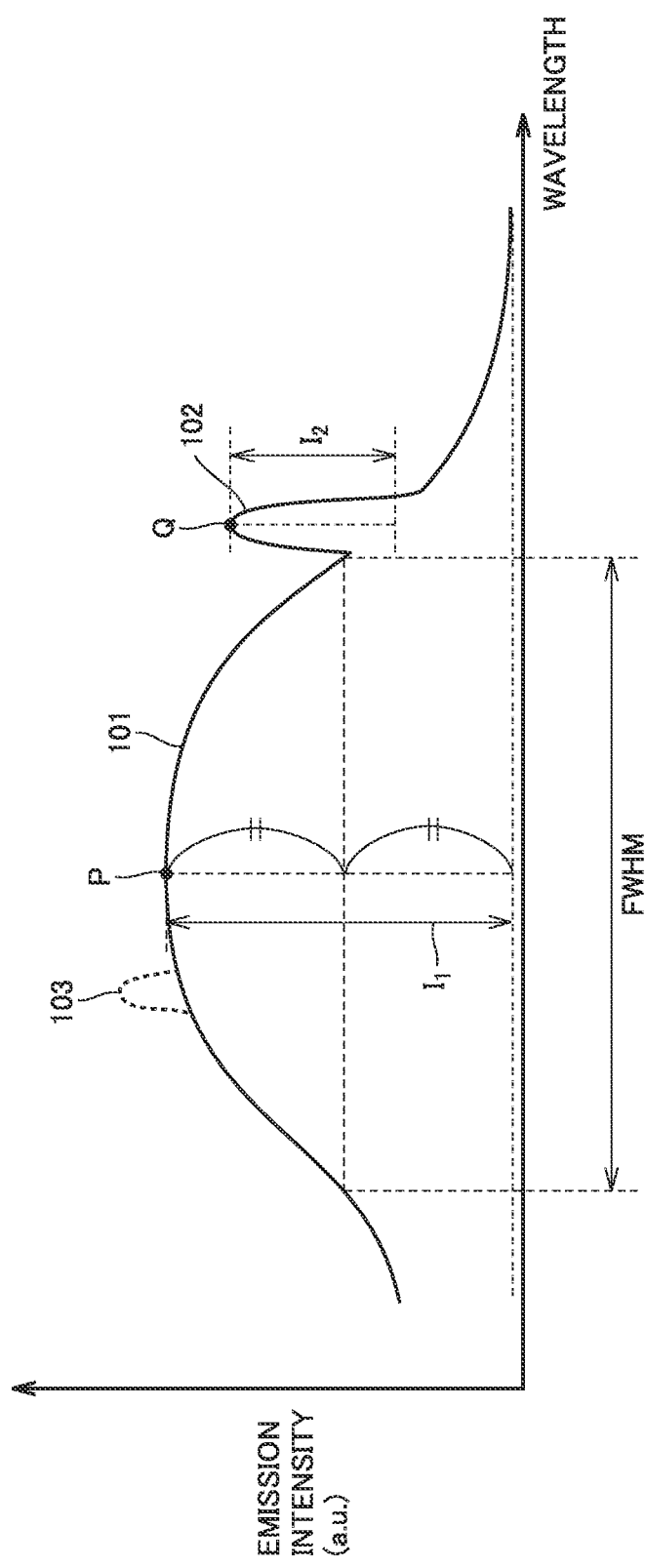
FIG. 4 is a schematic diagram of a photoluminescence spectrum of a diamond substrate in the present embodiment.

FIG. 4 schematically shows a photoluminescence (PL) spectrum of single crystal diamond substrate 50 obtained by applying, to single crystal diamond substrate 50, excitation light having a peak wavelength in a wavelength range of not less than 315 nm and not more than 335 nm at a temperature in a temperature range of not less than 7 K and not more than 83 K. As shown in FIG. 4, the photoluminescence spectrum of single crystal diamond substrate 50 includes a first emission peak 101 and a second emission peak 102.

First emission peak 101 has an emission peak wavelength in a wavelength range of not less than 450 nm and not more than 650 nm, and has a full width at half maximum (FWHM shown in FIG. 4) of not less than 50 nm. Second emission peak 102 has an emission peak wavelength in a wavelength range of not less than 570 nm and not more than 580 nm, and has a full width at half maximum of not more than 10 nm. A peak height $I_1$ of first emission peak 101 is not less than 0.1 times (1/10 times), preferably not less than 0.2 times (1/5 times), and more preferably not less than 0.5 times (1/2 times) as high as a peak height $I_2$ of second emission peak 102.

"Peak height $I_1$ of first emission peak 101" herein refers to the emission intensity after background correction at a vertex P included in first emission peak 101, and is calculated by the following formula.

(peak height $I_1$ of first emission peak 101)=(emission intensity at vertex P)−(emission intensity at the bottom of first emission peak 101)

"Peak height $I_2$ of second emission peak 102" herein refers to the emission intensity after background correction at a vertex Q included in second emission peak 102, and is calculated by the following formula.

(peak height $I_2$ of second emission peak 102)=(emission intensity at vertex Q)−(emission intensity of first emission peak 101 at the wavelength at vertex Q)

It was found that the emission characteristics of single crystal diamond substrate 50 were changed by the heat treatment. Specifically, before the heat treatment, the photoluminescence spectrum of diamond growth layer 20 had not only first emission peak 101 and second emission peak 102 but also a third emission peak 103 (having a full width at half maximum of 10 nm or less) identified as having an emission peak wavelength on the lower-wavelength side relative to the wavelength at vertex P, in a wavelength range of not less than 450 nm and not more than 650 nm. However, after the heat treatment, third emission peak 103 was not identified (FIG. 4).

Moreover, before the heat treatment, peak height $I_1$ of first emission peak 101 was less than 0.1 times (1/10 times) as high as peak height $I_2$ of second emission peak 102. However, by the heat treatment, peak height $I_1$ of first emission peak 101 was increased while peak height $I_2$ of second emission peak 102 was decreased. As a result of this, as described above, peak height $I_1$ of first emission peak 101 was not less than 0.1 times (1/10 times), preferably not less than 0.2 times (1/5 times), and more preferably not less than 0.5 times (1/2 times) as high as peak height $I_2$ of second emission peak 102. Thus, the emission characteristics of the single crystal diamond substrate can be examined to determine whether or not the single crystal diamond substrate has been subjected to the heat treatment.

Absorption Coefficient

Figure 5:
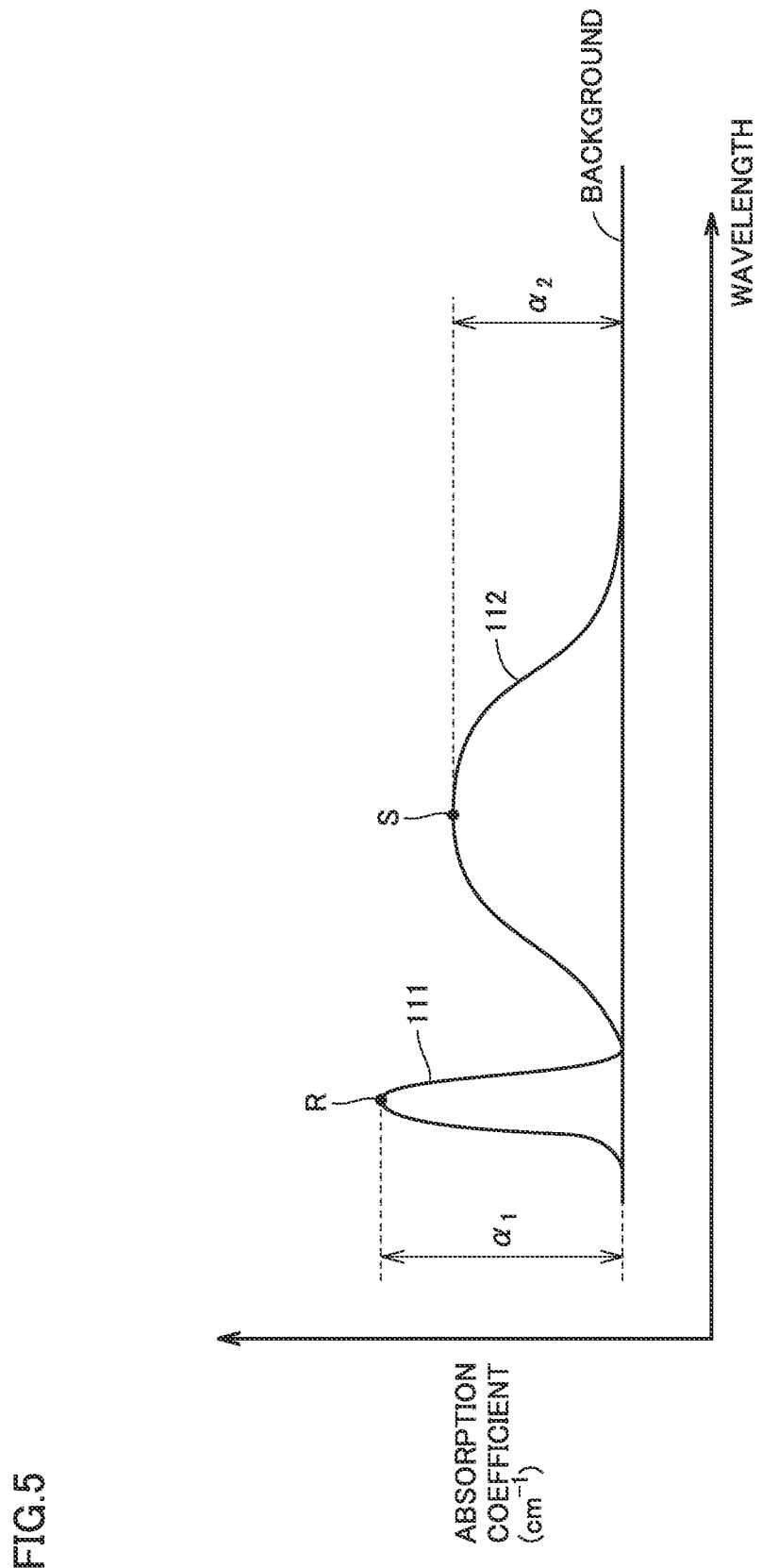
FIG. 5 is a schematic diagram of an absorption spectrum of a diamond substrate in the present embodiment.

FIG. 5 schematically shows an absorption spectrum of single crystal diamond substrate 50, with the wavelength plotted on the horizontal axis and the absorption coefficient plotted on the vertical axis. As shown in FIG. 5, the absorption spectrum of single crystal diamond substrate 50 includes a first absorption peak 111 having an absorption peak wavelength in a wavelength range of not less than 265 nm and not more than 275 nm, and a second absorption peak 112 having an absorption peak wavelength in a wavelength range of not less than 370 nm and not more than 390 nm. A peak height $\alpha_2$ of second absorption peak 112 is lower than a peak height $\alpha_1$ of first absorption peak 111, and is preferably less than 0.5 times (1/2 times) as high as peak height $\alpha_1$.

The absorption spectrum shown in FIG. 5 is calculated in accordance with the following method. A xenon lamp is used as a light source, the light with a wavelength range of not less than 200 nm and not more than 850 nm is split by a diffraction grating into its constituent colors, the light split into its constituent colors is applied to single crystal diamond substrate 50, and the transmittance of single crystal diamond substrate 50 is measured. A part of the light applied to single crystal diamond substrate 50 is transmitted through single crystal diamond substrate 50, another part thereof is absorbed by single crystal diamond substrate 50, and still another part thereof is reflected from the surface of single crystal diamond substrate 50 or may undergo multiple reflection from the surface of single crystal diamond substrate 50. In view of the above, the absorption coefficient of single crystal diamond substrate 50 is calculated.

"Peak height $\alpha_1$ of first absorption peak 111" refers to the absorption coefficient after background correction at vertex R included in first absorption peak 111. Likewise, "peak height $\alpha_2$ of second absorption peak 112" herein refers to the absorption coefficient after background correction at vertex S included in second absorption peak 112. For the absorption spectrum of single crystal diamond substrate 50 shown in FIG. 5, the background correction is made in accordance with the following method. In a formula expressing the absorption coefficient at each of vertex R and vertex S, the terms proportional to the first power, the second power, and the third power to which the wavelength is raised are cancelled, and only the term which is not proportional to the wavelength is extracted.

It was found that the absorption coefficient of single crystal diamond substrate 50 was changed by the heat treatment. Specifically, before the heat treatment, peak height $\alpha_2$ of second absorption peak 112 was higher than peak height $\alpha_1$ of first absorption peak 111, and even not less than 1.2 times as high as peak height $\alpha_1$ of first absorption peak 111 in some cases. However, after the heat treatment, peak height $\alpha_1$ of first absorption peak 111 was higher and peak height $\alpha_2$ of second absorption peak 112 was lower. As a result of this, as described above, peak height $\alpha_2$ of second absorption peak 112 was lower than peak height $\alpha_1$ of first absorption peak 111 and preferably less than 0.5 times (½ times) as high as peak height $\alpha_1$ of first absorption peak 111. Thus, the absorption coefficient of the single crystal diamond substrate can be examined to determine whether or not the single crystal diamond substrate has been subjected to the heat treatment.

Diamond substrate 50 of a polycrystal is obtained by the vapor phase synthesis method, and the average grain size of crystal grains in the polycrystal of diamond substrate 50 is not less than 30 μm, preferably not less than 60 μm, and more preferably not less than 90 μm. Such polycrystal diamond substrate 50 is easily separated from polycrystal diamond structure 30 and has a high crystal quality. The average grain size of crystal grains in the polycrystal of polycrystal diamond substrate 50 is measured with an SEM.

Resistivity

As described above, even when diamond structure 30 is electrically conductive, the heat treatment as described above can be performed on diamond structure 30 to separate diamond substrate 50. Therefore, diamond substrate 50 may include a layer having a resistivity of not less than $10^{-5}$ Ω·cm and not more than $10^{-2}$ Ω·cm to exhibit electrical conductivity, not less than $10^6$ Ω·cm and not more than $10^9$ Ω·cm to exhibit electrical insulation, or a resistivity between them. Alternatively, diamond substrate 50 as a whole may have a resistivity of not less than $10^{-5}$ Ω·cm and not more than $10^{-2}$ Ω·cm to exhibit electrical conductivity, not less than $10^6$ Ω·cm and not more than $10^9$ Ω·cm to exhibit electrical insulation, or a resistivity between them. In any case, the heat treatment can be performed to separate diamond substrate 50.

[Use of Diamond Substrate]

Diamond substrate 50 can be used as a substrate to be mounted with a device. For example, on first surface 51 or second surface 52 of diamond substrate 50, a diamond growth layer doped with an impurity or a diamond layer terminated with hydrogen atoms is formed. After this, an electrode and the like are formed. In this way, an electronic device (semiconductor device such as power semiconductor device or high-frequency semiconductor device, UV-emitting device, electron emission source, magnetic sensor, or biosensor, for example) can be manufactured.

Diamond substrate 50 may be used to fabricate a diamond composite substrate 70 described later herein, and use this diamond composite substrate 70 as a substrate to be mounted with a device.

In the case where diamond substrate 50 is used as a substrate to be mounted with a device, the second surface of diamond substrate 50 may be physically polished instead of being chemically polished. While the cost for chemical polishing is low, the chemically polished second surface is somewhat uneven, and therefore, the use of such a diamond substrate is limited to a device substrate on which vapor phase deposition is performed, tools, electrodes, and the like. In contrast, while the cost for physical polishing is somewhat higher than the cost for chemical polishing, the resultant flatness of second surface 52 of diamond substrate 50 is higher. Therefore, this diamond substrate 50 is applicable to uses requiring flatness. Preferably, the surface treatment method for second surface 52 is selected depending on the use of diamond substrate 50.

[Structure of Diamond Composite Substrate]

Figure 6:
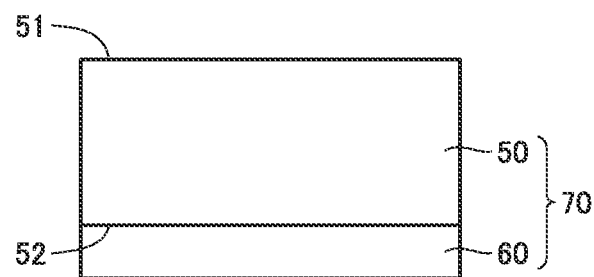
FIG. 6 is a cross-sectional view of a diamond composite substrate in the present embodiment.

FIG. 6 is a cross-sectional view of a diamond composite substrate 70 in the present embodiment. Diamond composite substrate 70 includes a diamond substrate 50 and an epitaxial layer 60 formed on a second surface 52 of diamond substrate 50. The method of forming epitaxial layer 60 and the material for epitaxial layer 60 are not particularly limited. Since diamond substrate 50 can be manufactured at a low cost and in a short time, diamond composite substrate 70 including diamond substrate 50 can also be manufactured at a low cost and in a short time. Diamond substrate 50 of diamond composite substrate 70 may be either a single crystal or a polycrystal.

In the case where diamond composite substrate 70 is used as a substrate to be mounted with a device, the second surface of diamond substrate 50 may be physically polished instead of chemically polished. The flatness of second surface 52 of diamond substrate 50 is accordingly higher. Preferably the surface treatment method for second surface 52 is selected depending on the use of diamond composite substrate 70.

EXAMPLES

The present invention will be hereinafter described in further detail based on Examples. The present invention, however, is not limited to them.

Example 1

Initially, a diamond seed substrate was produced. Specifically, a Type Ib diamond substrate (0.3 mm in thickness)

produced by the high-temperature high-pressure method was prepared. On the upper surface of the diamond substrate, a single crystal CVD diamond layer (0.2 mm in thickness) was formed by the CVD method. The upper surface of the diamond substrate was a surface having an off angle of 5 degrees or less relative to plane orientation (001). After this, diamond abrasive grains were used to polish the surface of the formed single crystal CVD diamond layer. In this way, a CVD diamond substrate (diamond seed substrate) was obtained. In the obtained CVD diamond substrate, the Type Ib diamond substrate had a thickness of 0.3 mm and the single crystal CVD diamond layer had a thickness of 0.2 mm.

Next, under the conditions indicated below, ions were implanted into a main surface (4 mm×4 mm in size) of the single crystal CVD diamond layer of the CVD diamond substrate. In this way, an ion implantation layer was formed at a side of the main surface of the single crystal diamond layer of the CVD diamond substrate. The ion implantation depth was about 0.4 μm. The variation of the ion implantation depth was about 30 nm.

Ion Implantation Conditions
kind of ions: hydrogen ions ($H^+$)
ion implantation energy: 90 keV
ion implantation dose: $7 \times 10^{17}$ $cm^{-2}$ Subsequently, on the main surface of the single crystal CVD diamond layer of the CVD diamond substrate, a single crystal diamond growth layer (0.3 mm in thickness) was epitaxially grown by the CVD method. After this, a laser beam was applied to a diamond crystal deposited on the side surface of the ion implantation layer to remove the diamond crystal. In this way, a diamond structure was obtained.

Subsequently, under the conditions indicated below, heat treatment was performed on the diamond structure, as a method for separation. Accordingly, the diamond structure was divided along the ion implantation layer into a first structure and a single crystal diamond substrate. Namely, the single crystal diamond substrate was separated.

Conditions for Separation
treatment temperature: 1000° C.
treatment time: one hour
treatment atmosphere: vacuum atmosphere ($1 \times 10^{-3}$ Pa)
partial pressure of oxygen gas: $1 \times 10^{-8}$ Pa After this, nitric acid and sulfuric acid were mixed at a ratio of 1:3 (volume ratio), and the resultant mixed acid was used to perform etching at 200° C. for two hours on the separated surface, which was exposed by this separation, of the single crystal diamond substrate. In this way, the single crystal diamond substrate with the separated surface having an arithmetic mean roughness Ra of 5 nm or less was obtained.

Examples 2-7

Single crystal diamond substrates were manufactured in accordance with a similar method to the above-described method in Example 1, except that changes were made as shown in Table 1 to the type of the diamond seed substrate, the size of the main surface or the nitrogen concentration at the main surface, the kind of implanted ions, the ion implantation energy, the ion implantation dose, or the method for separation or conditions for separation.

Comparative Example 1

The Type Ib diamond substrate used in Example 1 was prepared as a diamond seed substrate.

Next, under the conditions indicated below, ions were implanted, in two steps, into the main surface (4 mm×4 mm in size) of the Type Ib diamond substrate. In this way, an ion implantation layer was formed. The concentration of ions implanted into the diamond seed substrate was simulated, and this ion concentration was estimated at $1.4 \times 10^{20}$ $cm^{-3}$ to $2.2 \times 10^{21}$ $cm^{-3}$. While the ion implantation layer was electrically conductive, the Type Ib diamond substrate except for the ion implantation layer was electrically insulating. The ion implantation depth was about 0.38 μm.

Ion Implantation Conditions
kind of ions: carbon ions ($C^+$)
ion implantation energy: 350 keV, 280 keV
ion implantation dose: $1.2 \times 10^{16}$ $cm^{-2}$, $4 \times 10^{15}$ $cm^{-2}$ Subsequently, on the main surface, into which ions were implanted, of the Type Ib diamond substrate, a diamond growth layer (0.3 mm in thickness) was grown by the CVD method. After this, a laser beam was applied to a diamond crystal deposited on the side surface of the ion implantation layer to remove the diamond crystal. In this way, a diamond structure was obtained.

Subsequently, electrolytic etching was performed on the diamond structure. Specifically, pure water (etching solution) was placed in an electrolytic etching bath made of borosilicate glass. A pair of platinum electrodes was placed in the etching solution with a distance of about 1 cm between the electrodes, and the above-described diamond substrate was disposed between the platinum electrodes of the electrode pair in the etching solution. A voltage of 340 V was applied between the platinum electrodes of the electrode pair, and the diamond substrate was left therein until the ion implantation layer was electrolytically etched away completely.

Comparative Example 2

A single crystal diamond substrate was manufactured in accordance with the above-described method in Comparative Example 1, except that a Type Ib diamond substrate with a diameter of the main surface of two inches (50.8 mm) was used as a diamond seed substrate.

[Results and Analysis]

The results are shown in Table 1. In Table 1, "Type Ib+CVD layer" represents a single crystal CVD diamond seed substrate.

TABLE 1

|  |  |  | Example 1 | Example 2 | Example 3 | Example 4 | Example 5 |
|---|---|---|---|---|---|---|---|
| ion implantation conditions | diamond seed substrate | type | single crystal Type Ib + CVD layer | single crystal Type Ib + CVD layer | single crystal Type Ib + CVD layer | single crystal Type IIa | single crystal Type Ib + CVD layer |
|  |  | size of main surface | 4 mm × 4 mm | 2 inches (50.8 mm) in diameter | 4 mm × 4 mm | 4 mm × 4 mm | 4 mm × 4 mm |

TABLE 1-continued

|  |  | Example 1 | Example 2 | Example 3 | Example 4 | Example 5 |
|---|---|---|---|---|---|---|
|  | nitrogen concentration at main surface | 5 ppm or less | 5 ppm or less | 5 ppm or less | 0.1 ppm or less | 5 ppm or less |
|  | kind of ions | hydrogen | hydrogen | hydrogen | hydrogen | hydrogen |
|  | ion implantation energy | 90 keV | 90 keV | 90 keV | 50 keV | 200 keV |
|  | ion implantation dose (cm$^{-2}$) | $7 \times 10^{17}$ | $7 \times 10^{17}$ | $1 \times 10^{17}$ | $7 \times 10^{16}$ | $7 \times 10^{17}$ |
| method and conditions for separation | method | heat treatment | heat treatment | heat treatment | heat treatment | heat treatment |
|  | treatment temperature (° C.) | 1000 | 1200 | 1400 | 1600 | 2000 |
|  | treatment time (hours) | 1 | 1 | 1 | 1 | 1 |
|  | treatment atmosphere | vacuum atmosphere ($1 \times 10^{-3}$ Pa) | vacuum atmosphere ($1 \times 10^{-3}$ Pa) | inert gas (nitrogen gas) atmosphere | inert gas (nitrogen gas) atmosphere | inert gas (nitrogen gas) atmosphere |
|  | concentration or partial pressure of oxygen gas | $1 \times 10^{-8}$ Pa | $1 \times 10^{-6}$ Pa | 10 ppm | 10 ppm | 100 ppm |
| peak intensity ratio in PL spectrum (1st emission peak/2nd emission peak) |  | 0.125 | 0.25 | 1 | 2 | 5 |
| absorption peak intensity ratio (2nd absorption peak/1st absorption peak) |  | 0.8 | 0.7 | 0.4 | 0.2 | 0.1 |
| separated or not |  | separated | separated | separated | separated | separated |

|  |  |  | Example 6 | Example 7 | Comparative Example 1 | Comparative Example 2 |
|---|---|---|---|---|---|---|
| ion implantation conditions | diamond seed substrate | type | single crystal Type Ib + CVD layer | single crystal Type Ib | single crystal Type Ib | single crystal Type Ib |
|  |  | size of main surface | 4 mm × 4 mm | 4 mm × 4 mm | 4 mm × 4 mm | 2 inches (50.8 mm) in diameter |
|  |  | nitrogen concentration at main surface | 5 ppm or less | 3-100 ppm | 3-100 ppm | 3-100 ppm |
|  | kind of ions |  | helium | hydrogen | carbon | carbon |
|  | ion implantation energy |  | 90 keV | 90 keV | 350 keV 280 keV | 350 keV 280 keV |
|  | ion implantation dose (cm$^{-2}$) |  | $4 \times 10^{17}$ | $7 \times 10^{17}$ | $1.2 \times 10^{16}$ $4 \times 10^{15}$ | $1.2 \times 10^{16}$ $4 \times 10^{15}$ |
| method and conditions for separation | method |  | heat treatment | heat treatment | electrolytic etching | electrolytic etching |
|  | treatment temperature (° C.) |  | 1200 | 1400 | — | — |
|  | treatment time (hours) |  | 1 | 1 | 13 | 100 |
|  | treatment atmosphere |  | inert gas (nitrogen gas) atmosphere | inert gas (nitrogen gas) atmosphere | — | — |
|  | concentration or partial pressure of oxygen gas |  | 100 ppm | 1000 ppm | — | — |
| peak intensity ratio in PL spectrum (1st emission peak/2nd emission peak) |  |  | 0.25 | 1 | 0.083 | 0.083 |
| absorption peak intensity ratio (2nd absorption peak/1st absorption peak) |  |  | 0.7 | 0.4 | 2 | 2 |
| separated or not |  |  | separated | separated | separated (13 hours) | not separated (100 hours) |

As shown in Table 1, regarding Examples 1 to 7, the single crystal diamond substrate could be separated by the heat treatment for one hour. In contrast, regarding Comparative Example 1, the single crystal diamond substrate could be separated by electrolytic etching for 13 hours and, regarding Comparative Example 2, the single crystal diamond substrate could not be separated even by the electrolytic etching for 100 hours. Thus, regarding the Examples, single crystal diamond substrates having a large area ranging from 4 mm×4 mm to a diameter of two inches could be obtained in a short time of one hour by a low-cost method, namely heat treatment.

In Example 1, a single crystal diamond substrate of 4 mm×4 mm was manufactured. In Example 2, a single crystal diamond substrate with a diameter of two inches (50.8 mm) was manufactured. However, Example 1 and Example 2 were identical to each other in terms of the time taken for separating the single crystal diamond substrate. It was accordingly found, regarding the method of manufacturing a single crystal diamond substrate in the Examples, the time taken for separating the single crystal diamond substrate did not depend on the size of the single crystal diamond substrate.

In Example 1, the ion implantation dose was $7 \times 10^{17}$ cm$^{-2}$, the heat treatment temperature was 1000° C., the heat treatment atmosphere was a vacuum atmosphere at $1 \times 10^{-3}$ Pa, and the partial pressure of oxygen gas for the heat treatment was $1 \times 10^{-8}$ Pa. In Example 3, the ion implantation dose was $1 \times 10^{17}$ cm$^{-2}$, the heat treatment temperature was 1400° C., the heat treatment atmosphere was a nitrogen gas atmosphere containing nitrogen gas as an inert gas at 100 kPa (atmospheric pressure), and the concentration of oxygen gas for the heat treatment was 10 ppm. However, Example 1 and Example 3 were identical to each other in terms of the time taken for separating the single crystal diamond substrate. It was accordingly found, regarding the method of manufacturing a single crystal diamond substrate in the Examples, the single crystal diamond substrate could be separated by optimizing the treatment temperature, the treatment atmosphere, or the concentration or partial pressure of oxygen gas for the heat treatment, depending on the ion implantation dose.

In Example 1, the diamond seed substrate was a single crystal CVD diamond substrate (with a nitrogen concentration at the main surface of 5 ppm or less), the ion implantation dose was $7\times10^{17}$ cm$^{-2}$, the heat treatment temperature was 1000° C., the heat treatment atmosphere was a vacuum atmosphere at $1\times10^{-3}$ Pa, and the partial pressure of oxygen gas for the heat treatment was $1\times10^{-8}$ Pa. In Example 4, the diamond seed substrate was a single crystal Type IIa diamond substrate (with a nitrogen concentration at the main surface of 0.1 ppm or less), the ion implantation dose was $7\times10^{16}$ cm$^{-2}$, the heat treatment temperature was 1600° C., the heat treatment atmosphere was a nitrogen gas atmosphere containing nitrogen gas as an inert gas at 100 kPa (atmospheric pressure), and the concentration of oxygen gas for the heat treatment was 10 ppm. However, Example 1 and Example 4 were identical to each other in terms of the time taken for separating the single crystal diamond substrate. It was accordingly found, regarding the method of manufacturing a single crystal diamond substrate in the Examples, the single crystal diamond substrate could be separated by optimizing the treatment temperature, the treatment atmosphere, or the concentration or partial pressure of oxygen gas for the heat treatment, depending on the nitrogen concentration at the main surface of the diamond seed substrate.

In Example 1, the ion implantation energy was 90 keV, the heat treatment temperature was 1000° C., the heat treatment atmosphere was a vacuum atmosphere at $1\times10^{-3}$ Pa, and the partial pressure of oxygen gas for the heat treatment was $1\times10^{-8}$ Pa. In Example 5, the ion implantation energy was 200 keV, the heat treatment temperature was 2000° C., the heat treatment atmosphere was a nitrogen gas atmosphere containing nitrogen gas as an inert gas at 100 kPa (atmospheric pressure), and the concentration of oxygen gas for the heat treatment was 100 ppm. However, Example 1 and Example 5 were identical to each other in terms of the time taken for separating the single crystal diamond substrate. It was accordingly found, regarding the method of manufacturing a single crystal diamond substrate in the Examples, the single crystal diamond substrate could be separated by optimizing the treatment temperature, the treatment atmosphere, or the concentration or partial pressure of oxygen gas for the heat treatment, depending on the ion implantation energy.

In Example 1, ions of hydrogen atoms were implanted. In Example 6, ions of helium atoms were implanted. However, Example 1 and Example 6 were identical to each other in terms of the time taken for separating the single crystal diamond substrate. It was accordingly found, regarding the method of manufacturing a single crystal diamond substrate in the Examples, the single crystal diamond substrate could also be separated by using ions of helium atoms instead of ions of hydrogen atoms.

In Example 1, the diamond seed substrate was a single crystal CVD diamond substrate (with a nitrogen concentration at the main surface of 5 ppm or less), the heat treatment temperature was 1000° C., the heat treatment atmosphere was a vacuum atmosphere at $1\times10^{-3}$ Pa, and the partial pressure of oxygen gas for the heat treatment was $1\times10^{-8}$ Pa. In Example 7, the diamond seed substrate was a single crystal Type Ib diamond substrate (with a nitrogen concentration at the main surface of 3 to 100 ppm), the heat treatment temperature was 1400° C., the heat treatment atmosphere was a nitrogen gas atmosphere containing nitrogen gas as an inert gas at 100 kPa (atmospheric pressure), and the concentration of oxygen gas for the heat treatment was 1000 ppm. However, Example 1 and Example 7 were identical to each other in terms of the time taken for separating the single crystal diamond substrate. It was accordingly found, regarding the method of manufacturing a single crystal diamond substrate in the Examples, the single crystal diamond substrate could be separated by optimizing the treatment temperature, the treatment atmosphere, or the concentration or partial pressure of oxygen gas for the heat treatment, even when a single crystal Type Ib diamond substrate was used as a diamond seed substrate.

In contrast, in Comparative Example 1, although the single crystal diamond substrate was separated, the time taken for the separation was 13 hours. In Comparative Example 2, the single crystal diamond substrate was not separated even after 100 hours. Based on these results, it was found that the time taken for the separation was considerably longer when the single crystal diamond substrate was separated by electrolytic etching, as compared with Examples 1 to 7, and the time taken for the separation was considerably longer when the size of the main surface of the single crystal diamond substrate was larger.

Example 8

Initially, a diamond seed substrate was produced. Specifically, as a base substrate, a polycrystal diamond substrate (152.4 mm in diameter (six inches in diameter), 0.3 mm in thickness, and 30 μm in average grain size of crystal grains in the polycrystal at the main surface) produced by the hot filament CVD method was prepared. On the upper surface of the polycrystal diamond substrate, a polycrystal CVD diamond layer (0.2 mm in thickness) was formed by the microwave plasma CVD method. After this, diamond abrasives were used to polish the formed polycrystal CVD diamond layer from the surface to a depth of 0.1 mm. In this way, a polycrystal CVD diamond substrate (diamond seed substrate) was obtained. The obtained polycrystal CVD diamond substrate had a thickness of 0.4 mm. The average grain size of crystal grains in the polycrystal at the main surface of the polycrystal diamond CVD layer-side was measured with an SEM, and the average grain size was 30 μm or more.

Next, under the conditions indicated below, ions were implanted into a main surface (152.4 mm in diameter (six inches in diameter)) of the polycrystal CVD diamond layer of the polycrystal CVD diamond substrate. In this way, an ion implantation layer was formed at a side of the main surface of the polycrystal CVD diamond layer of the CVD diamond substrate. The ion implantation depth was about 0.4 μm. The variation of the ion implantation depth was about 30 nm.

Ion Implantation Conditions
kind of ions: hydrogen ions (H$^+$)
ion implantation energy: 90 keV
ion implantation dose: $7\times10^{17}$ cm$^{-2}$ Subsequently, on the main surface of the polycrystal diamond layer of the polycrystal CVD diamond substrate, a diamond growth layer (0.3 mm in thickness) was epitaxially grown by the CVD method. After this, a laser beam was applied to a diamond crystal deposited on the side surface of the ion implantation layer to remove the diamond crystal. In this way, a diamond structure was obtained.

Subsequently, under the conditions indicated below, heat treatment was performed on the diamond structure, as a method for separation. Accordingly, the diamond structure was divided along the ion implantation layer into a first structure and a polycrystal diamond substrate. Namely, the polycrystal diamond substrate was separated.

Conditions for Separation
treatment temperature: 1000° C.
treatment time: one hour
treatment atmosphere: vacuum atmosphere ($1 \times 10^{-2}$ Pa)
partial pressure of oxygen gas: $1 \times 10^{-5}$ Pa After this, nitric acid and sulfuric acid were mixed at a ratio of 1:3 (volume ratio), and the resultant mixed acid was used to perform etching at 200° C. for two hours on the separated surface, which was exposed by this separation, of the polycrystal diamond substrate. In this way, the polycrystal diamond substrate with the separated surface having an arithmetic mean roughness Ra of 5 nm or less was obtained.

Examples 9, 10

Polycrystal diamond substrates were manufactured in accordance with a similar method to the above-described method in Example 1, except that changes were made as shown in Table 2 to the size of the main surface of the diamond seed substrate, the average grain size of crystal grains in the polycrystal of the main surface, or the nitrogen concentration at the main surface, the kind of implanted ions, the ion implantation energy, the ion implantation dose, or the method for separation or conditions for separation.

Comparative Example 3

The polycrystal CVD diamond substrate used in Example 8 was prepared as a diamond seed substrate.

Next, under the conditions indicated below, ions were implanted, in two steps, into the main surface (152.4 mm in diameter (six inches in diameter)) of the polycrystal diamond seed substrate. In this way, an ion implantation layer was formed. The concentration of ions implanted into the diamond seed substrate was simulated, and this ion concentration was estimated at $1.4 \times 10^{20}$ cm$^{-3}$ to $2.2 \times 10^{21}$ cm$^{-3}$. While the ion implantation layer was electrically conductive, the polycrystal diamond substrate except for the ion implantation layer was electrically insulating. The ion implantation depth was about 0.38 μm.

Ion Implantation Conditions
kind of ions: carbon ions (C$^+$)
ion implantation energy: 350 keV, 280 keV
ion implantation dose: $1.2 \times 10^{16}$ cm$^{-2}$, $4 \times 10^{15}$ cm$^{-2}$ Subsequently, on the main surface, into which ions were implanted, of the polycrystal CVD diamond substrate, a polycrystalline diamond growth layer (0.3 mm in thickness) was grown by the CVD method. After this, a laser beam was applied to a diamond crystal deposited on the side surface of the ion implantation layer to remove the diamond crystal. In this way, a diamond structure was obtained.

Subsequently, electrolytic etching was performed on the diamond structure. Specifically, pure water (etching solution) was placed in an electrolytic etching bath made of borosilicate glass. A pair of platinum electrodes was placed in the etching solution with a distance of about 1 cm between the electrodes, and the above-described diamond substrate was disposed between the platinum electrodes of the electrode pair in the etching solution. A voltage of 340 V was applied between the platinum electrodes of the electrode pair, and the diamond substrate was left therein until the ion implantation layer was electrolytically etched away completely.

[Results and Analysis]

The results are shown in Table 2. In Table 2, "base+CVD layer" represents a polycrystal CVD diamond seed substrate.

TABLE 2

| | | | Example 8 | Example 9 | Example 10 | Comparative Example 3 |
|---|---|---|---|---|---|---|
| ion implantation conditions | diamond seed substrate | type | polycrystal base + CVD layer | polycrystal base + CVD layer | polycrystal base + CVD layer | polycrystal base + CVD layer |
| | | size of main surface | 6 inches (152.4 mm) in diameter | 8 inches (203.2 mm) in diameter | 8 inches (203.2 mm) in diameter | 6 inches (152.4 mm) in diameter |
| | | average crystal grain size | 30 μm | 60 μm | 90 μm | 30 μm |
| | | nitrogen concentration at main surface | 5 ppm or less | 5 ppm or less | 5 ppm or less | 5 ppm or less |
| | kind of ions | | hydrogen | hydrogen | hydrogen | carbon |
| | ion implantation energy | | 90 keV | 90 keV | 90 keV | 350 keV, 280 keV |
| | ion implantation dose (cm$^{-2}$) | | $7 \times 10^{17}$ | $7 \times 10^{17}$ | $1 \times 10^{17}$ | $1.2 \times 10^{16}$, $4 \times 10^{15}$ |

TABLE 2-continued

|  |  | Example 8 | Example 9 | Example 10 | Comparative Example 3 |
|---|---|---|---|---|---|
| method and conditions for separation | method for separation | heat treatment | heat treatment | heat treatment | electrolytic etching |
|  | treatment temperature (° C.) | 1000 | 1200 | 1400 | — |
|  | treatment time (hours) | 1 | 1 | 1 | 100 |
|  | treatment atmosphere | vacuum atmosphere ($1 \times 10^{-2}$ Pa) | vacuum atmosphere ($1 \times 10^{-2}$ Pa) | inert gas (nitrogen gas) atmosphere | — |
|  | concentration or partial pressure of oxygen gas | $1 \times 10^{-5}$ Pa | $1 \times 10^{-4}$ Pa | 10 ppm |  |
| peak intensity ratio in PL spectrum (1st emission peak/2nd emission peak) |  | — | — | — | 5 |
| absorption peak intensity ratio (2nd absorption peak/1st absorption peak) |  | — | — | — | — |
| separated or not |  | separated | separated | separated | not separated (100 hours) |

As shown in Table 2, regarding Examples 8 to 10, the polycrystal diamond substrate could be separated by the heat treatment for one hour. In contrast, regarding Comparative Example 3, the polycrystal diamond substrate could not be separated even by electrolytic etching for 100 hours. Thus, regarding the Examples, polycrystal diamond substrates having a large area ranging from six inches to eight inches in diameter could be obtained in a short time of one hour by a low-cost method, namely heat treatment.

In Example 8, a polycrystal diamond substrate having a diameter of six inches (152.4 mm) was manufactured. In Example 9, a polycrystal diamond substrate having a diameter of eight inches (203.2 mm) was manufactured. However, Example 8 and Example 9 were identical to each other in terms of the time taken for separating the polycrystal diamond substrate. It was accordingly found, regarding the method of manufacturing a polycrystal diamond substrate in the Examples, the time taken for separating the polycrystal diamond substrate did not depend on the size of the polycrystal diamond substrate.

In Example 8, the ion implantation dose was $7\times10^{17}$ cm$^{-2}$, the heat treatment temperature was 1000° C., the heat treatment atmosphere was a vacuum atmosphere at $1\times10^{-2}$ Pa, and the partial pressure of oxygen gas for the heat treatment was $1\times10^{-5}$ Pa. In Example 10, the ion implantation dose was $1\times10^{17}$ cm$^{-2}$, the heat treatment temperature was 1400° C., the heat treatment atmosphere was a nitrogen gas atmosphere containing nitrogen gas as an inert gas at 100 kPa (atmospheric pressure), and the concentration of oxygen gas for the heat treatment was 10 ppm. However, Example 8 and Example 10 were identical to each other in terms of the time taken for separating the polycrystal diamond substrate. It was accordingly found, regarding the method of manufacturing a polycrystal diamond substrate in the Examples, the polycrystal diamond substrate could be separated by optimizing the treatment temperature, the treatment atmosphere, or the concentration or partial pressure of oxygen gas for the heat treatment, depending on the ion implantation dose.

In contrast, in Comparative Example 3, the polycrystal diamond substrate was not separated even after 100 hours. It was found that the time taken for the separation was considerably longer when the polycrystal diamond substrate was separated by electrolytic etching, as compared with Examples 8 to 10, and the time taken for the separation was considerably longer when the size of the main surface of the polycrystal diamond substrate was larger.

It should be construed that the embodiments and examples disclosed herein are given by way of illustration in all respects, not by way of limitation. It is intended that the scope of the present invention is defined by claims, not by the embodiments and examples described above, and encompasses all modifications and variations equivalent in meaning and scope to the claims.

REFERENCE SIGNS LIST 10 diamond seed substrate; 11 main surface; 15 ion implantation layer; 15a first ion implantation layer; 15b second ion implantation layer; 20 diamond growth layer; 30 diamond structure; 40 first structure; 50 diamond substrate; 51 first surface; 52 second surface; 60 epitaxial layer; 70 diamond composite substrate; 101 first emission peak; 102 second emission peak; 103 third emission peak; 111 first absorption peak; 112 second absorption peak

The invention claimed is:

1. A diamond substrate of a single crystal,
    a photoluminescence spectrum of the diamond substrate including
        a first emission peak having an emission peak wavelength in a wavelength range of not less than 450 nm and not more than 650 nm, and
        a second emission peak having an emission peak wavelength in a wavelength range of not less than 570 nm and not more than 580 nm, the photoluminescence spectrum being obtained by applying, to the diamond substrate, excitation light having a peak wavelength in a wavelength range of not less than 315 nm and not more than 335 nm at a temperature in a temperature range of not less than 7 K and not more than 83 K,
    the first emission peak having a full width at half maximum of not less than 50 nm,
    the second emission peak having a full width at half maximum of not more than 10 nm, and
    a peak height of the first emission peak being not less than 0.1 times as high as a peak height of the second emission peak, wherein the diamond substrate includes:
  a first surface; and
  a second surface located opposite to the first surface,
a concentration of first atoms at the second surface is higher than a concentration of the first atoms at the first surface, the first atoms being different from atoms forming a diamond crystal structure,
the concentration of the first atoms decreases from the second surface toward an inside of the diamond substrate, in a thickness direction of the diamond substrate, and
the concentration of the first atoms at the second surface is not less than 100 times as high as the concentration of the first atoms in the inside of the diamond substrate.

2. The diamond substrate according to claim 1, wherein in at least a part of the second surface, a mesh structure defined by a protrusion or depression with a height of not less than 1 nm and not more than 50 nm surrounding flat regions is formed, and
the flat regions of the second surface each have a size of not less than 3 µm and not more than 30 µm.

\* \* \* \* \*